United States Patent
Brown et al.

(10) Patent No.: US 6,218,704 B1
(45) Date of Patent: *Apr. 17, 2001

(54) ESD PROTECTION STRUCTURE AND METHOD

(75) Inventors: Jeffrey S. Brown, Jeffersonville; Steven J. Holmes, Milton; Robert K. Leidy; Steven H. Voldman, both of Burlington, all of VT (US)

(73) Assignee: International Business Machines Corporation, Armonk, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/851,973

(22) Filed: May 7, 1997

(51) Int. Cl.[7] .......................... H01L 23/62; H01L 29/00; H01L 29/74; H01L 31/111

(52) U.S. Cl. ..................... 257/355; 257/356; 257/358; 257/359; 257/546

(58) Field of Search .................... 257/546, 355, 257/356, 358, 398, 399, 173

(56) References Cited

U.S. PATENT DOCUMENTS

| | | | |
|---|---|---|---|
| 4,405,708 | 9/1983 | van Pelt et al. | 430/281 |
| 4,516,313 * | 5/1985 | Turi et al. | 29/571 |
| 4,568,631 | 2/1986 | Badami et al. | 430/315 |
| 4,687,730 | 8/1987 | Eron | 430/324 |
| 4,707,218 | 11/1987 | Giammarco et al. | 156/643 |
| 4,799,990 | 1/1989 | Kerbaugh et al. | 156/636 |
| 4,805,008 * | 2/1989 | Yao et al. | 357/42 |
| 5,150,187 * | 9/1992 | Huang | 357/43 |
| 5,330,879 | 7/1994 | Dennison | 430/313 |
| 5,545,911 * | 8/1996 | Otsuki et al. | 257/376 |
| 5,576,557 * | 11/1996 | Ker et al. | 257/173 |
| 5,640,299 * | 6/1997 | Leach | 361/56 |
| 5,654,574 * | 8/1997 | Williams et al. | 257/355 |
| 5,675,171 * | 10/1997 | Kokubun | 257/400 |
| 5,682,047 * | 10/1997 | Consiglio et al. | 257/355 |
| 5,770,504 * | 6/1998 | Brown et al. | 438/296 |
| 5,880,502 * | 3/1999 | Lee et al. | 257/399 |
| 5,889,309 * | 3/1999 | Yu et al. | 257/363 |
| 5,895,958 * | 4/1999 | Miki | 257/355 |
| 5,903,420 * | 5/1999 | Ham | 257/355 |
| 5,939,767 * | 8/1999 | Brown et al. | 257/551 |

FOREIGN PATENT DOCUMENTS 5-297597    11/1993   (JP) .

OTHER PUBLICATIONS

J.M. Never and S.H. Voldman, Failure analysis of shallow trench isolated ESD structures, Journal of Electrostatics, vol. 38, pp. 93–112, (1996).

S.H. Voldman, S.S. Furkay, and J.R. Slinkman, Three–dimensional transient electrothermal simulation of electrostatic discharge protection circuits, Journal of Electrostatics, vol. 36, pp. 55–80, (1995).

* cited by examiner

Primary Examiner—Eddie C. Lee
Assistant Examiner—Jesse A. Fenty
(74) Attorney, Agent, or Firm—Schmeiser, Olsen & Watts; Eugene I. Schurko

(57) ABSTRACT

The preferred embodiment of the present invention overcomes the limitations of the prior art and provides a device and method to increase the robustness of electrostatic discharge (ESD) protection devices by reducing the temperature gradient caused by ESD pulses and reducing the likelihood of thermal runaway caused by large ESD pulses. The preferred embodiment forms implants under the trench isolation structures in the ESD devices. The implants reduce the current-caused heating that can lead to thermal runaway, and thus improve the robustness of the ESD protection device. In the preferred embodiment, the implants are formed using hybrid resist. The hybrid resist provides a method to form that implants that does not require additional masking steps or other excessive processing. Additionally, the hybrid resist provides implants that are self aligned with the well regions.

15 Claims, 24 Drawing Sheets

ESD PROTECTION STRUCTURE AND METHOD

RELATED APPLICATIONS

This application is related to tie following co-pending U.S. patent applications, Ser. No. 08/715,288, Docket No. F19-96-055, for "Low 'K' Factor Hybrid Photoresist," and Ser. No. 08/715,287, Docket No. BU9-96-047, for "Frequency Doubling Photoresist," both filed Sep. 16, 1996.

BACKGROUND OF THE INVENTION

1. Technical Field

This invention generally relates to semiconductor devices, and more specifically relates to methods and structures to improve electrostatic discharge (ESD) and power-to-failure robustness in high current and high voltage environments.

2. Background Art

Modem semiconductor devices are highly susceptible to damage from electrical overstress (EOS), electrostatic discharge (ESD), as well as overvoltage and overcurrent conditions. EOS and ESD events can be caused by static charge from machines and people induced EOS events, ESD events, electromagnetic (EM) interference, EM field induction, and other processes.

Many commonly used integrated circuits contain elements, such as MOSFET transistors, resistors, capacitors and interconnects that can fail when a ESD event occurs. As a result, on-chip ESD protection circuitry, off-chip circuitry, and package solutions are used for EOS/ESD protection of integrated semiconductor devices.

One method of protecting devices from ESD damage is to provide ESD protection structures that drain ESD current before the voltage damages the device, without interfering with the normal operation of the device. To do this an ESD structure is connected to every input and output pin on a chip. With the ESD structure connected in parallel to every pin, ESD pulses can be safely drained away from the devices before damage is done to the device.

FIG. 27 is a cross sectional schematic view of a representative prior art ESD structure 800. The ESD structure 800 comprises a dual diode structure that can be used to provide ESD protection in a variety of applications. The dual-diode ESD structure 800 simplistically consists of a p-n diode connected between the pad node and the Vdd power supply and a second diode between the pad node and substrate ground.

The ESD structure 800 is fabricated in a p-type substrate 802. Not shown in the figure is a guard ring that defines the perimeter of the ESD structure 800. The guard ring preferably comprises a N+ region diffused into an N-well. The guard ring is typically connected to a positive bias Vdd and serves to collect electrons injected within the ESD structure before the electrons diffuse toward neighboring circuits and cause latch-up there. Inside the guard ring are a plurality of diffused regions comprising the dual diode ESD structure.

The ESD device 800 is also connected to bias Vdd at several diffusion regions. In particular, Vdd is connected to N++ diffusion 816 and N++ diffusion 812 inside N-well 808 and to N++ diffusion 820 inside N-well 804. With Vdd connected to N-well 808, the N-well 808/p-substrate 802 junction is normally reversed biased, with no appreciable current flowing to p-substrate 802. The input node of the ESD protection device is connected to a P++ diffusion 814 inside n-well 808 and to N++ diffusion 818 inside n-well 806.

Between the various diffusions and wells are formed a plurality of shallow trench isolation (STI) structures 810. Shallow trench isolation structures 810 are trenches formed in the substrate 802 and filled with a dielectric such as silicon dioxide ($SiO_2$) The STI 810 structures serve to isolate the diffusion regions and to define the N+ and P+ implants. The use STIs for isolation is becoming more common in CMOS technologies because of increased scaling to smaller dimensional spacing.

Again, the ESD device 800 is generally referred to as a dual diode device. In particular, the P++ diffusion 814 and the N-well 808 comprise a first diode, with the P++ diffusion 814 being the anode and the N-well 808 being the cathode. Likewise, the N++ diffusion 818 and the N-well 806 combine to form the cathode of the second diode with the P-type substrate 802 being the anode. Thus, the ESD device comprises two stacked diodes, with one attached to ground (through the substrate) and the other attached to Vdd, and with input node connected to the node between them. By connected the input node to other devices (i.e., input buffers), the input node is able to absorb electrostatic discharges before the device it is protecting is damaged.

The robustness of an ESD protection device is determined by the amount of discharge that can be absorbed by the ESD protection device without the ESD protection device failing. The techniques used to measure the robustness of an ESD protection device typically use a human body model (HBM) ESD simulator. A 100 pF capacitor is charged to a high voltage, a switch is closed, discharging the capacitor through a 1500 ohm resistor and into the ESD protection device. This process is generally repeated with increasing voltages until the ESD device fails at different ESD polarities.

As an example of ESD device 800 operation, assume an ESD pulse positive with respect to Vdd strikes the input node. This forward biases the P++ diffusion 814/n-well 808 junction (diode 1) and current flows laterally from the P++ diffusion 814 to both N++ diffusion 812 and N++ diffusion 816. The larger the ESD pulse, the larger the current.

The ESD protection device also provides protection for negative ESD pulses. For example, with Vdd attached to ground an ESD pulse that is negative with respect to ground causes current to flow from Vdd to the N-well diode. The negative pulse forward biases the N-well 806/substrate 802 diode, causing current to flow from the Vdd power supply to the input node. In particular, current flows from N+ diffusions 820 and 816 through their relative N-wells and into N-well 806 and N++ diffusion 818. These laterally flowing currents flow through NPN structures, with N-wells 804 and 808 acting as the emitter, the P-substrate 802 acting as the base, and the N-well 806 acting as the collector or a forward-biased parasitic lateral bipolar NPN transistor.

In all these cases, the current flowing under the STI structures 810 causes the regions directly under the STI structures 810 to significantly heat up by Joule heating. Initially, the peak occurs at the diode edges slightly above ambient due to current crowding at the N++ diffusion - STI corner. As the ESD current increases, the peak-heating center migrates toward the P++ diffusion along the SI-silicon interface and increases in temperature. This increase in temperature happens very quickly, within 17 to 25 nanoseconds of the peak ESD impulse current. During this time, little thermal diffusion has taken place and the temperature of the surrounding regions, and in particular, the area around P++ diffusion 814, is much lower than STI-silicon interface region.

This temperature gradient, if high enough, can lead to junction dopant migration and diodic failure. Thus, the temperature gradient caused by the Joule heating limits the robustness of prior art ESD protection devices.

Furthermore, in cases where the ESD current is high enough, the temperature under the STI can rise to the "intrinsic temperature" of silicon. The intrinsic temperature is the temperature at which intrinsic carrier concentration exceeds the doping concentration. This makes the region quasi-intrinsic and the generation rate of carriers increases, which in turn creates more heat and so on. The generation rate of carriers increases as the intrinsic carrier concentration increases with respect to the intrinsic recombination time. This process, called thermal runaway, continues until the ESD device fails.

For more information on ESD failures see J. M. Never and S. H. Voldman, Failure analysis of shallow trench isolated BSD structures, Journal of Electrostatics, Volume 38, pg. 93–112, (1996).

Prior art ESD devices have kept the width of the STI structures 810 relatively wide to help prevent thermal runaway from occurring. Unfortunately, this solution is not acceptable as the required device densities continue to increase. Therefore, what is needed is a method and structure for limiting the possibility of thermal runaway while allowing for increased device scaling and without requiring excessive mask layers and processing steps.

DISCLOSURE OF INVENTION

The present invention overcomes the limitations of the prior art and provides a device and method to increase the robustness of electrostatic discharge (ESD) protection devices by reducing the temperature gradient caused by ESD pulses and reducing the likelihood of thermal runaway caused by large ESD pulses. The preferred embodiment forms implants under the trench isolation structures in the ESD devices. The implants reduce the current-caused heating that can lead to thermal runaway, and thus improve the robustness of the ESD protection device. In the preferred embodiment, the implants are formed using hybrid resist. The hybrid resist provides a method to form that implants that does not require additional masking steps or other excessive processing. Additionally, the hybrid resist provides implants that are self aligned with the well regions.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Figure 1:
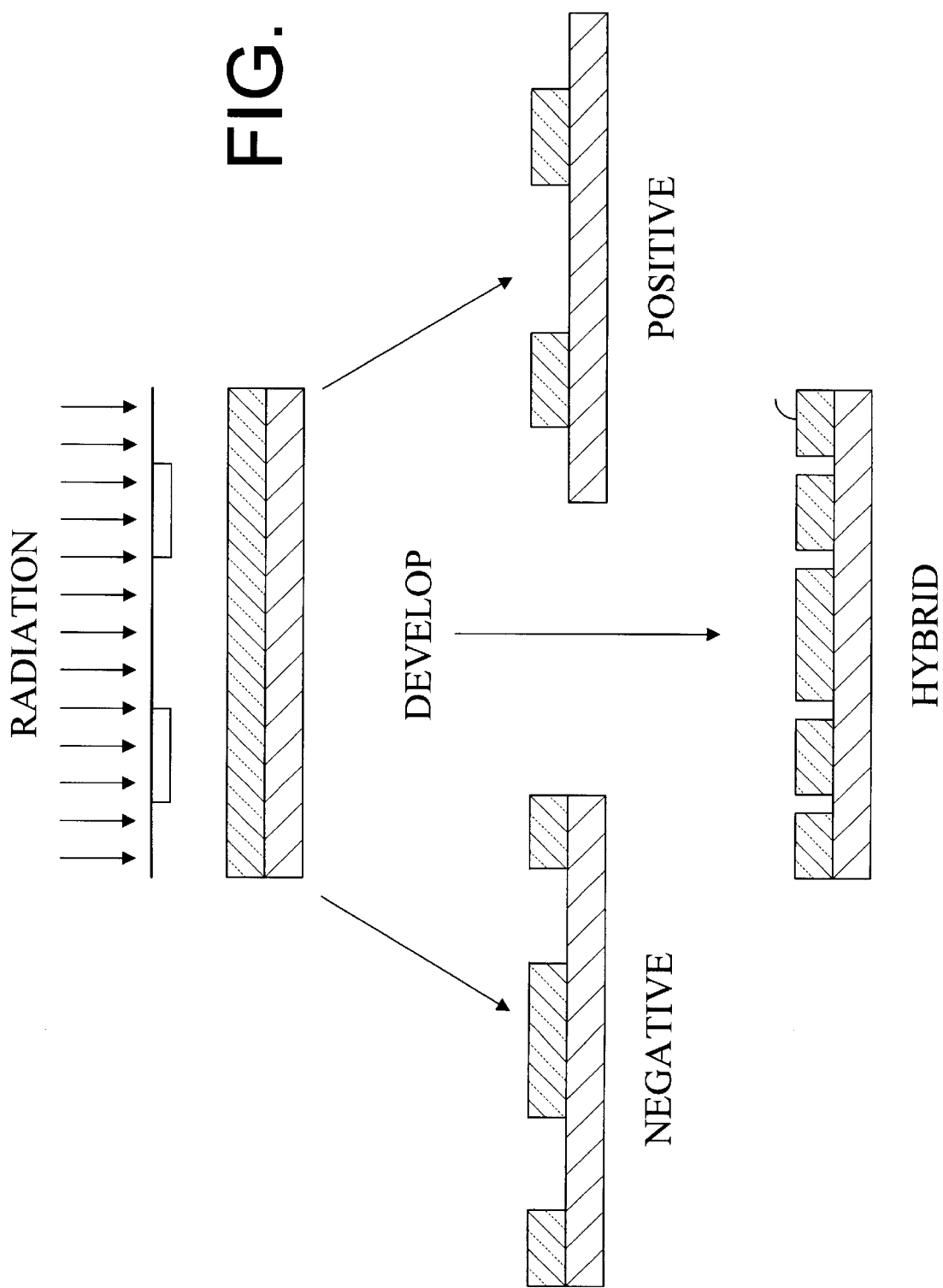
FIG. 1 is a schematic diagram showing the use of the hybrid resist.

The preferred embodiment of the present invention overcomes the limitations of the prior art and provides a device and method to increase the robustness of electrostatic discharge (ESD) protection devices by reducing the temperature gradient caused by ESD pulses and reducing the likelihood of thermal runaway caused by large ESD pulses. The preferred embodiment forms implants under the trench isolation structures in the ESD devices. The implants reduce the current-caused heating that can lead to thermal runaway, and thus improve the robustness of the ESD protection device.

The implants are preferably formed using hybrid resist. The hybrid resist provides a method to form that implants that does not require additional masking steps or other excessive processing. Additionally, the hybrid resist provides implants that are self aligned with the well regions.

A description of hybrid photoresist will now be given, followed by a description of the preferred embodiment structures and methods.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This "frequency doubling" capability of this resist allows conventional expose systems to be extended to higher pattern densities. It is an advantage of one example of hybrid resist that lines and spaces of 0.2 μm and less can be printed with current deep ultra violet (DUV) lithography tools that are designed for operation at 0.35 μm resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 μm feature with conventional resist generally requires a 0.2μm reticle image size. With hybrid resist, a 0.2 μm space can be formed with a single edge of a reticle feature; for example, a 0.5μm reticle opening could produce two 0.2 μm spaces and a 0.2 μm line. In this way, one could accomplish 'reduction' x-ray or E-beam lithography; the reticle image pitch could be approximately 2x the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1x reticle, i.e., a reticle that normally has a one-to-one relationship with the image printed on the substrate, because variations in the image size on the reticle are normally reproduced on the substrate.

Figure 22:
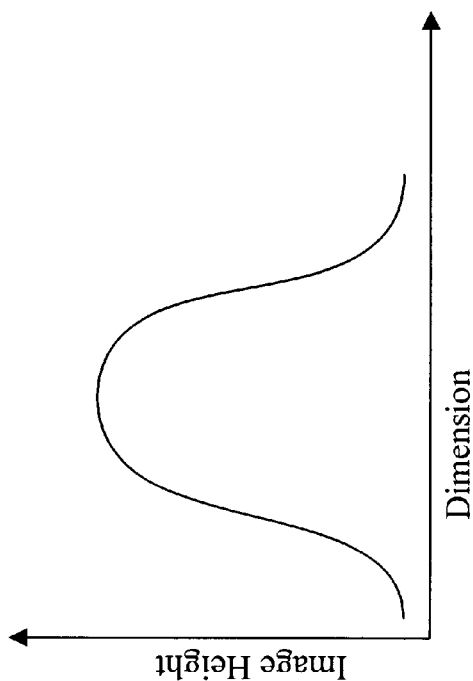
FIG. 22 is a graph illustrating the line pattern for positive resist printed with a reticle line pattern.
Figure 21:
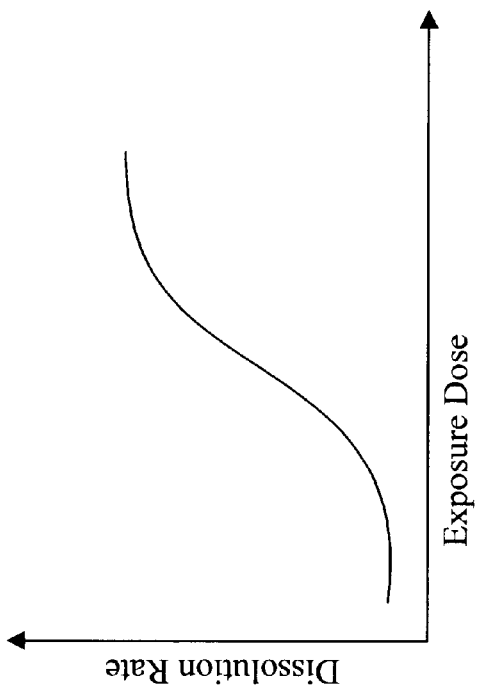
FIG. 21 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 21, a graph is illustrated showing how positive resist undergoes an increase in solubility as the exposure dose is increased. Turning to FIG. 22, the line pattern for positive resist printed with a reticle line pattern is illustrated.

Figure 24:
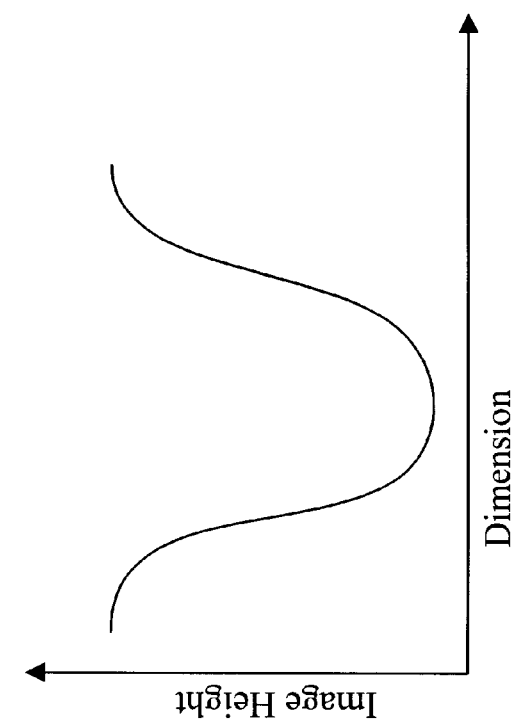
FIG. 24 is a graph illustrating the line pattern for negative resist printed with a reticle line pattern.
Figure 23:
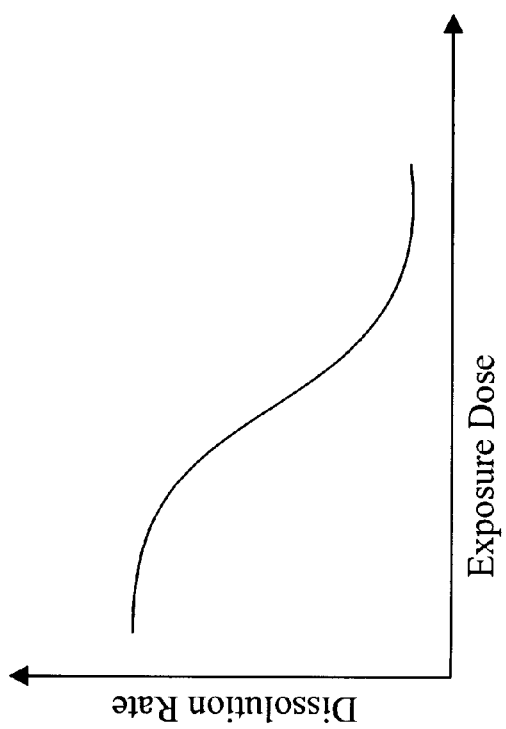
FIG. 23 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 23. Turning to FIG. 24, the line pattern for negative resist printed with a reticle line pattern is illustrated.

Figure 26:
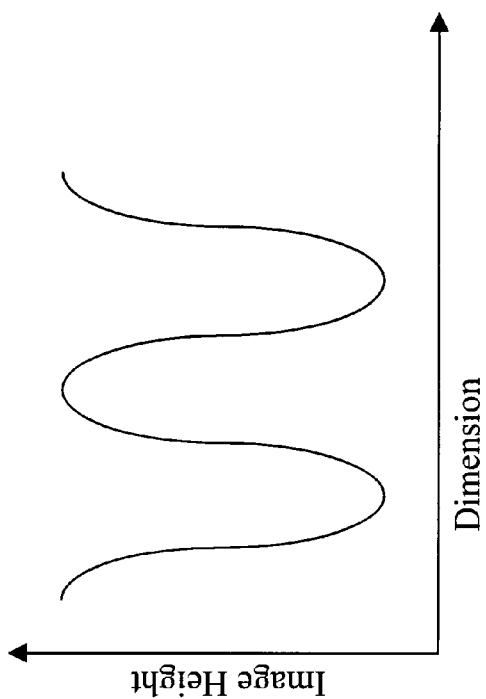
FIG. 26 is a graph illustrating the space/line/space pattern formed onto a substrate using hybrid resist.
Figure 25:
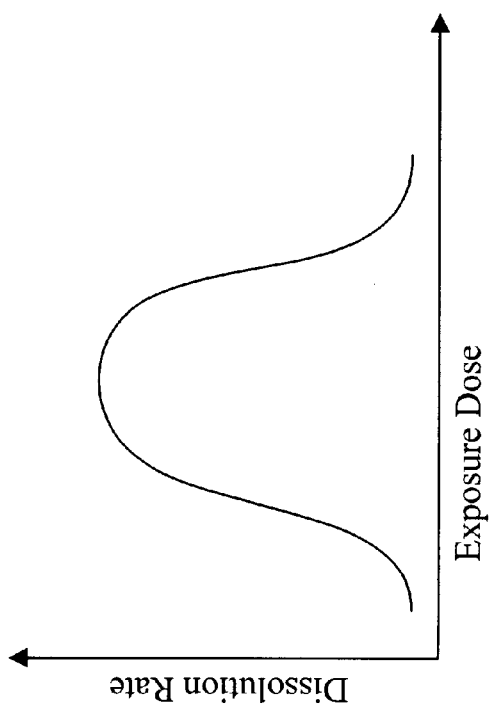
FIG. 25 is a graph of the resist solubility as a function of exposure dose for hybrid resist.
Figure 27:
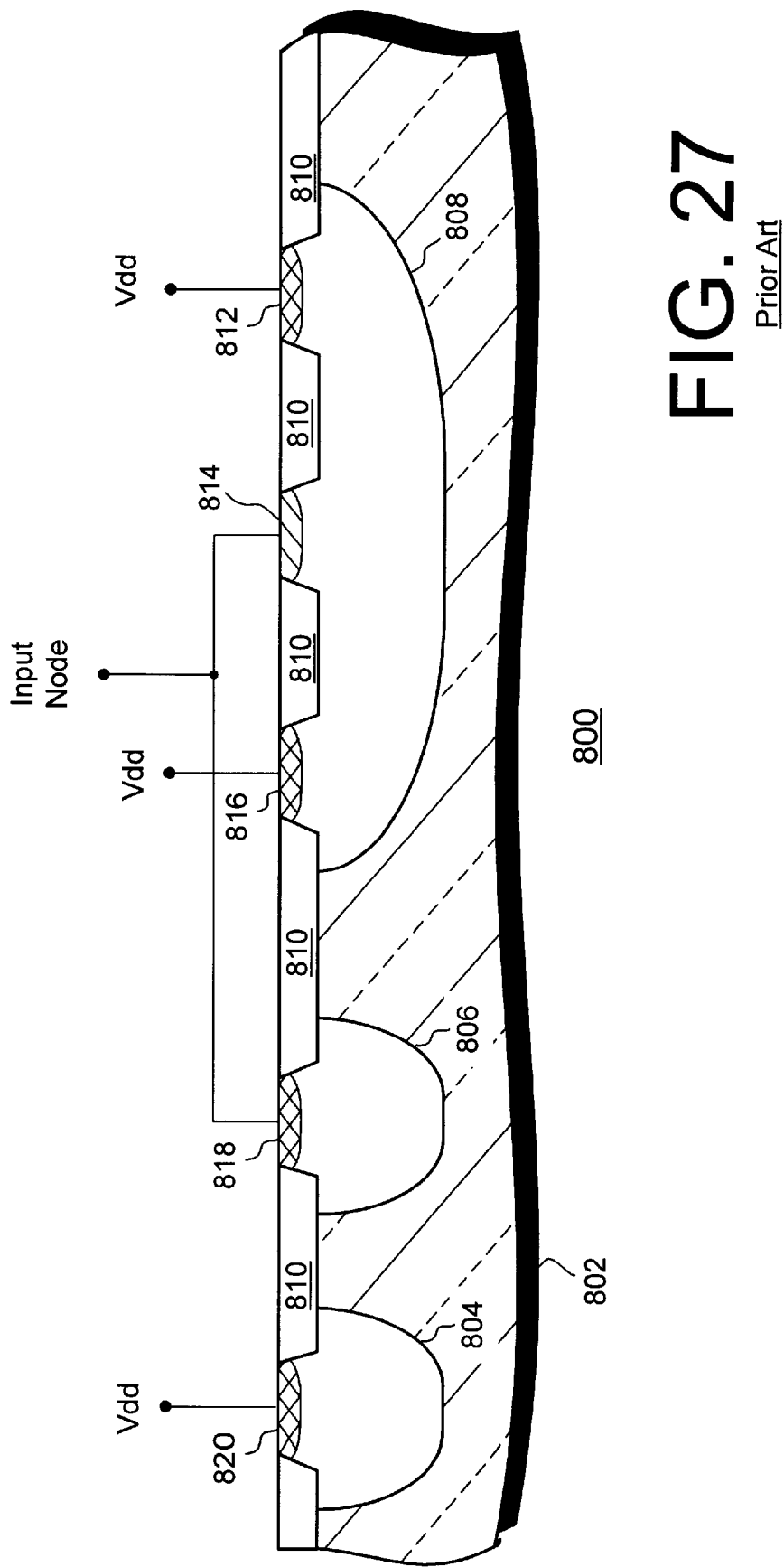
FIG. 27 is a cross-sectional side view of a prior art ESD protection device.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 25, the graph of the resist solubility as a function of exposure dose for hybrid resist is illustrated. Printing a reticle line pattern onto a substrate results in the space/line/space pattern illustrated in FIG. 26. In this manner, the aerial image is "frequency doubled" to produce twice the number of features than would otherwise be attainable with the standard resist. FIG. 1 illustrates these salient differences between a positive resist, a negative resist, and a hybrid resist.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 4:
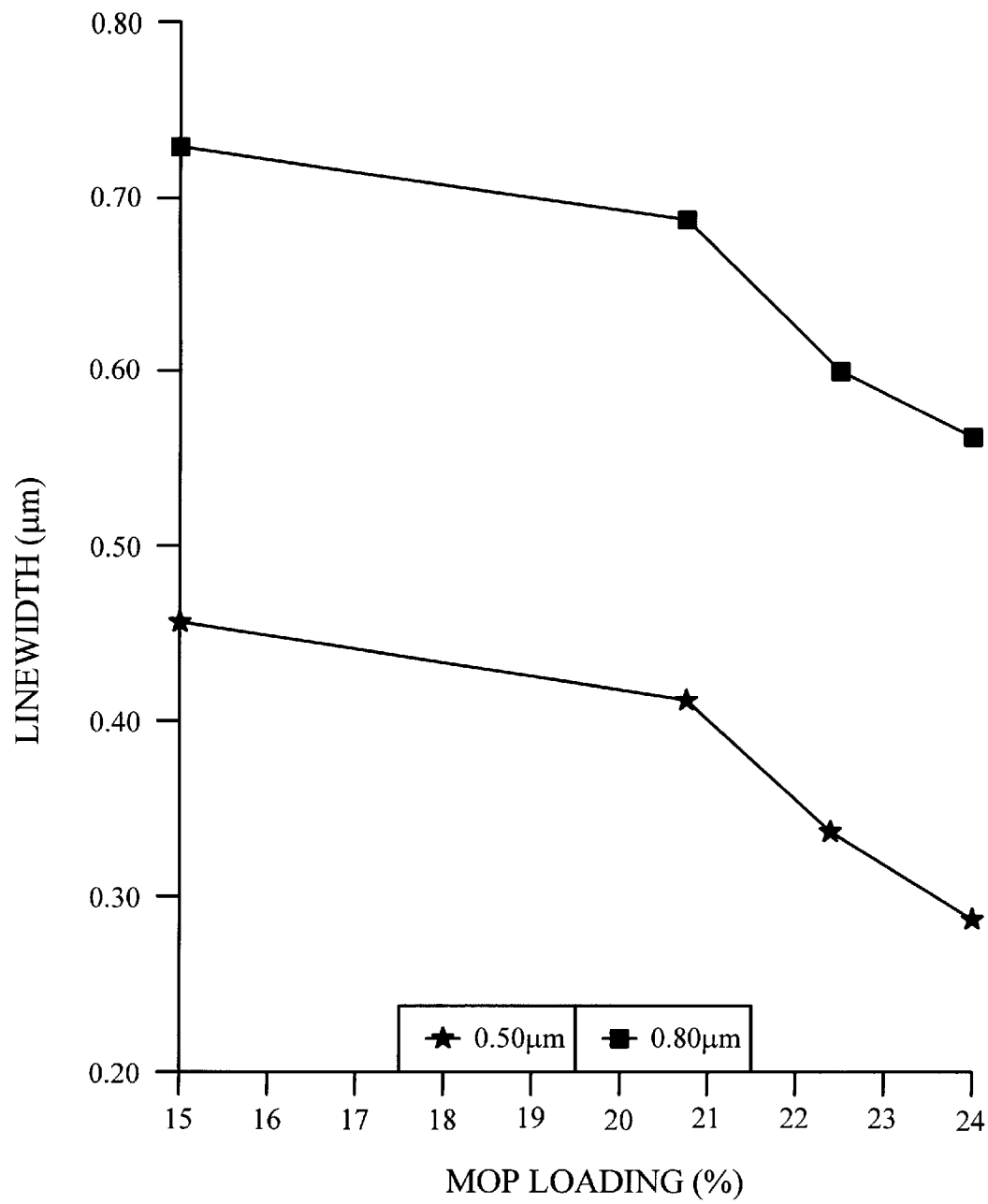
FIG. 4 is a graph showing the linewidth in nm plotted against the amount of positive tone solubility inhibitor (MOP) incorporated in a hybrid resist of the present invention.
Figure 9:
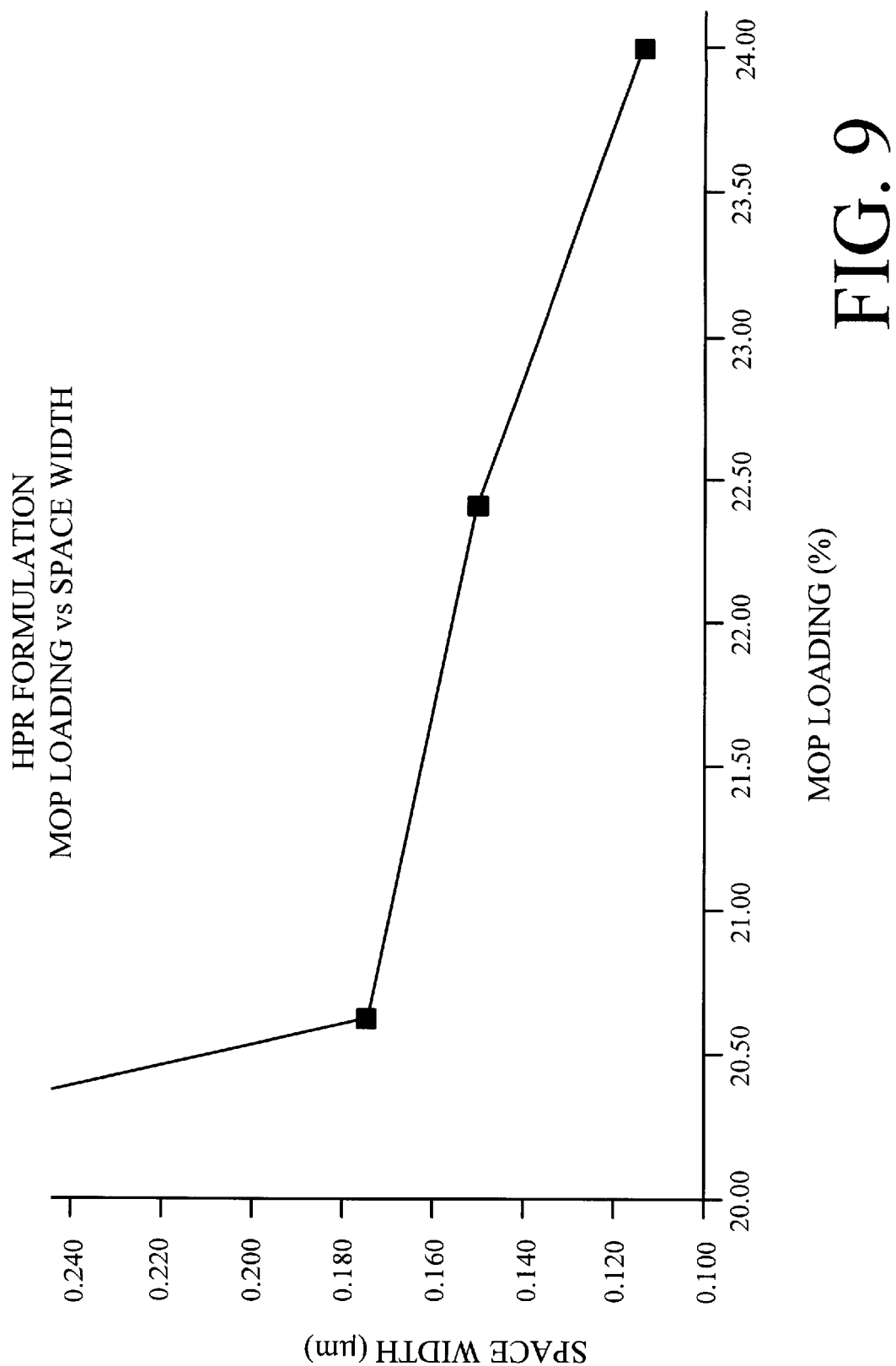
FIG. 9 is a graph showing the variation in space width in μm as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 9). This approach may also be used to alter the isofocal print bias of the negative tone line; at higher positive tone solubility inhibitor concentrations, the isofocal print bias of the negative tone line increases (FIG. 4). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post- expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 2:
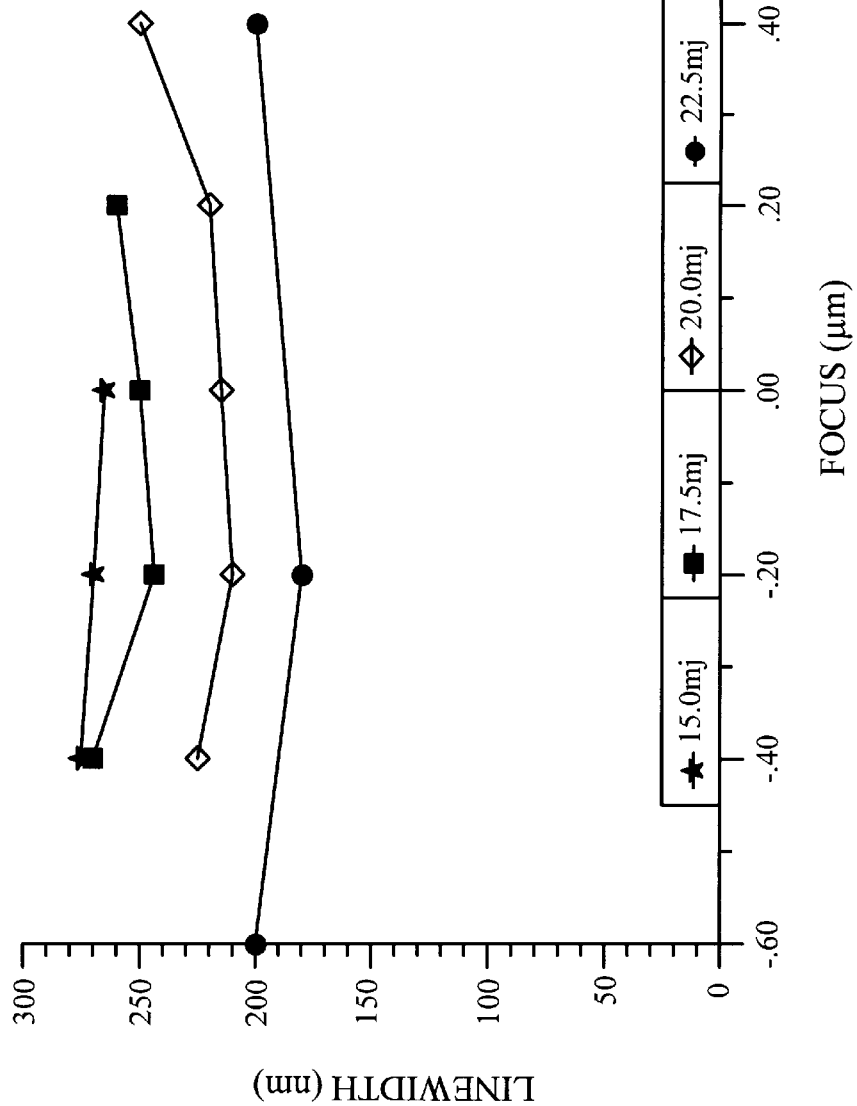
FIG. 2 is a graph of linewidth in nanometers (nm) plotted against focus in microns (μm) of a formulation of a standard negative resist at various exposure energies.
Figure 3:
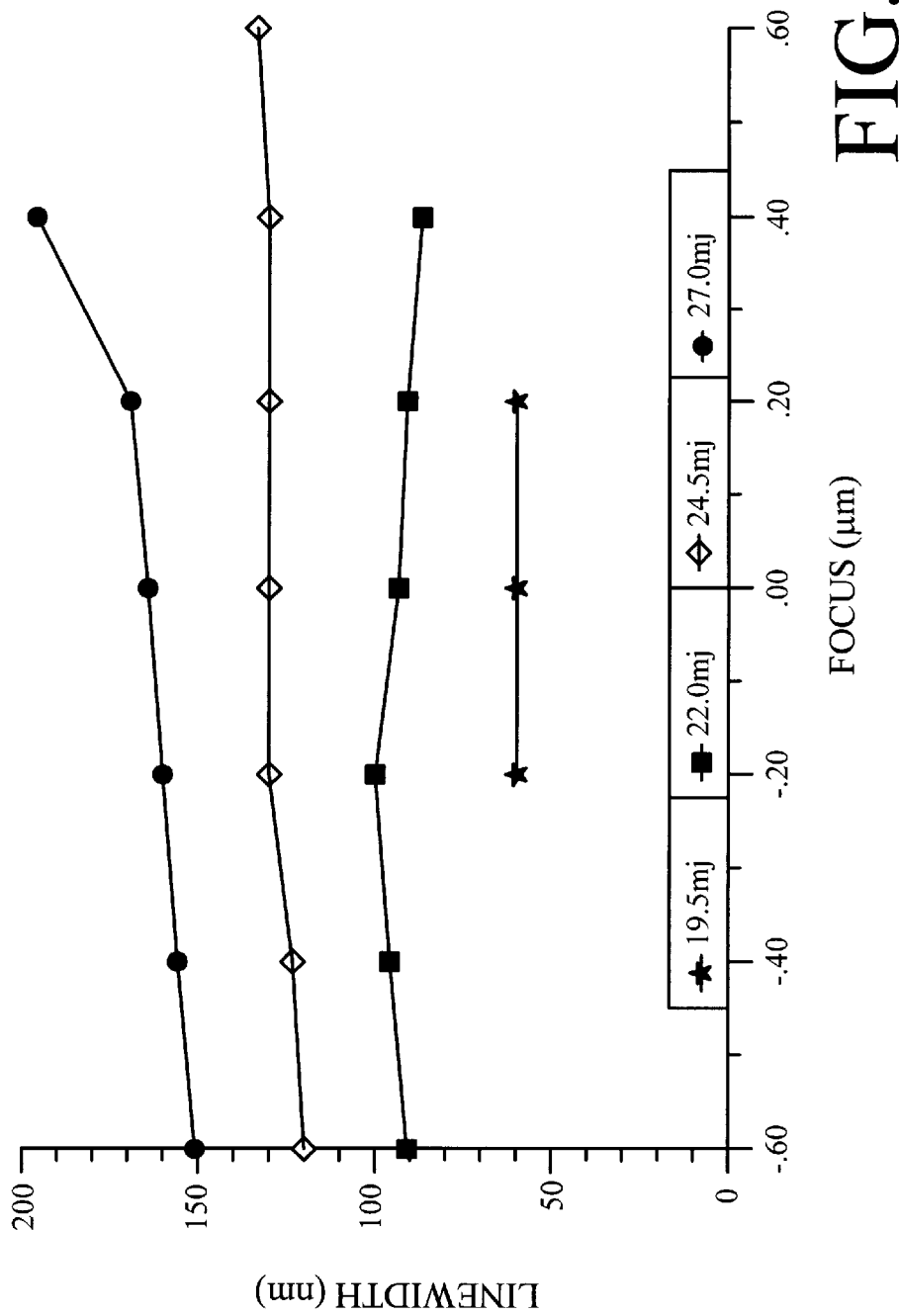
FIG. 3 is a graph of linewidth for a negative tone line of a hybrid pattern in nm plotted against focus in μm of a hybrid resist of the present invention at various exposure energies.

An advantage of using the hybrid resist in such applications is that the negative tone line of the hybrid resist can exhibit a large print bias at its isofocal point, as shown in FIG. 3. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 2. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of 10 the negative tone line. For example, by choosing an appropriate loading factor for the positive tone solubility inhibitor, one may obtain a particular print bias as shown in FIG. 4. In theory, it is quite obvious that similar variations in the photoresist response can also be brought about by making appropriate changes in concentrations and reactivities of other components as well.

Figure 5:
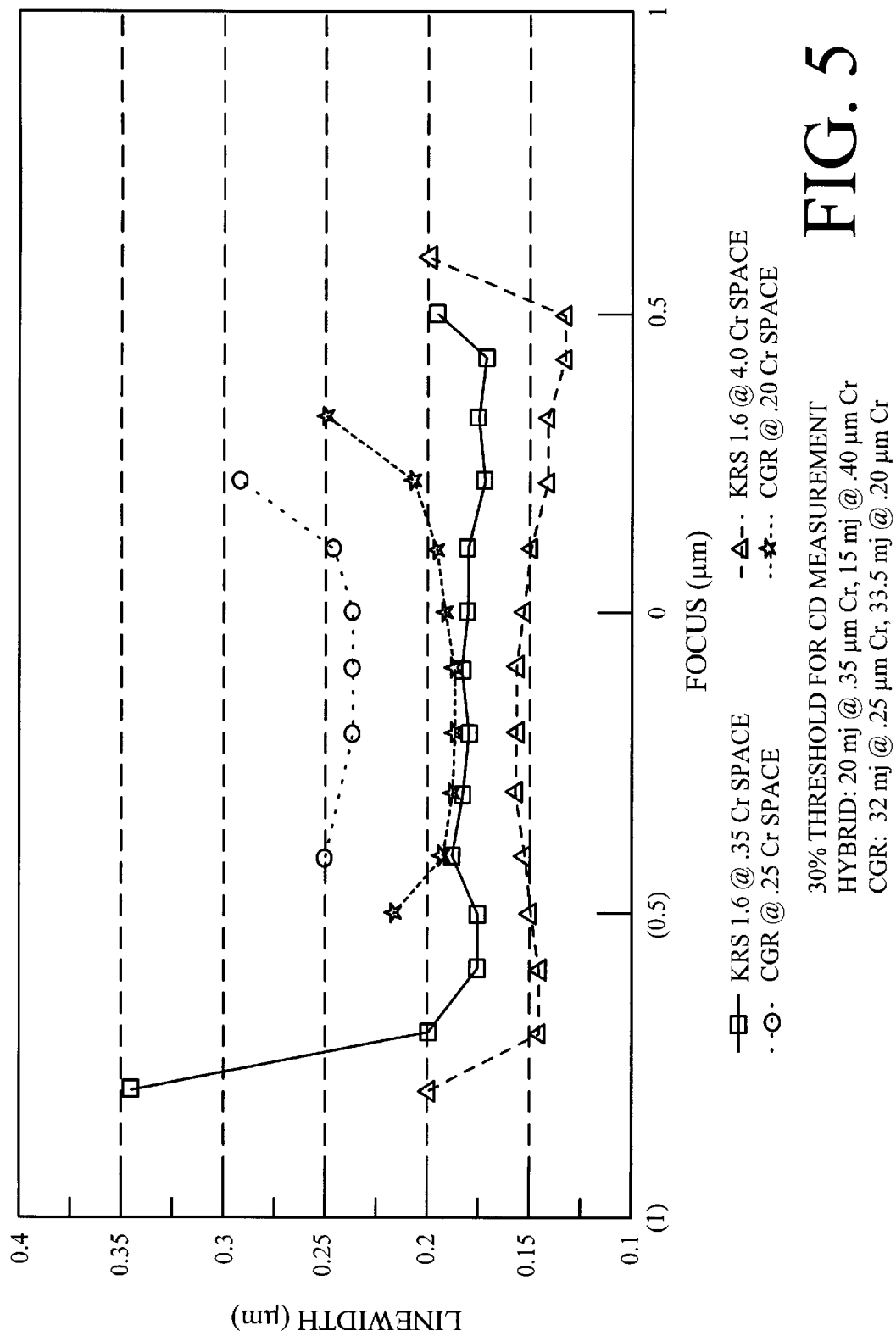
FIG. 5 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.1 $\mu$m larger than the isofocal print bias for a standard negative tone resist, as exemplified in FIGS. 2 and 3 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 5. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

In a further processing refinement, the features that are typically obtained can be trimmed with a second masking step if they are not desired.

The following examples are exemplary of the frequency doubling resist composition, but are not meant to be limiting and many variations will be readily apparent to one of ordinary skill in the art. The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi, Tex.; novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM—C, commercially available from Maruzen America of New York, N.Y. The PHM—C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

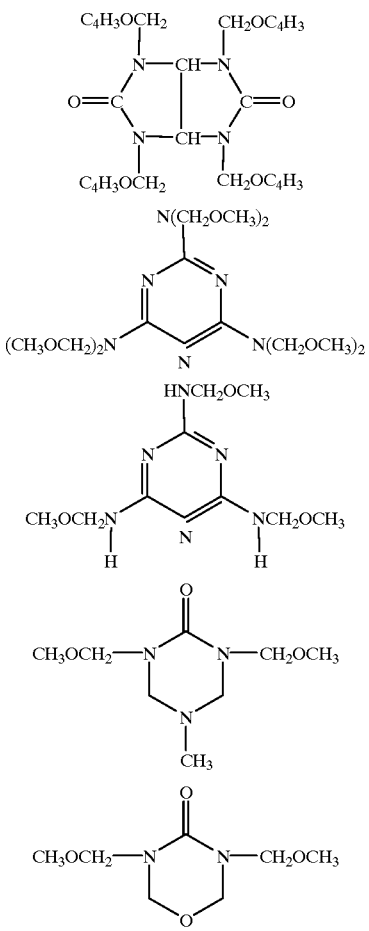

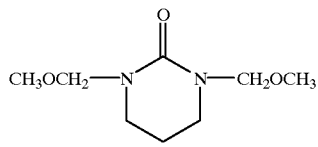

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/ butylated glycol-urils, for example of the formula:

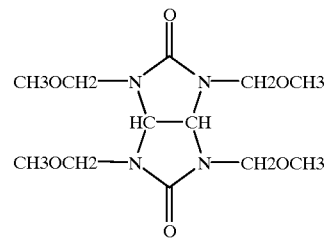

as can be found in Canadian Patent No.1 204547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diazyliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

Figure 6:
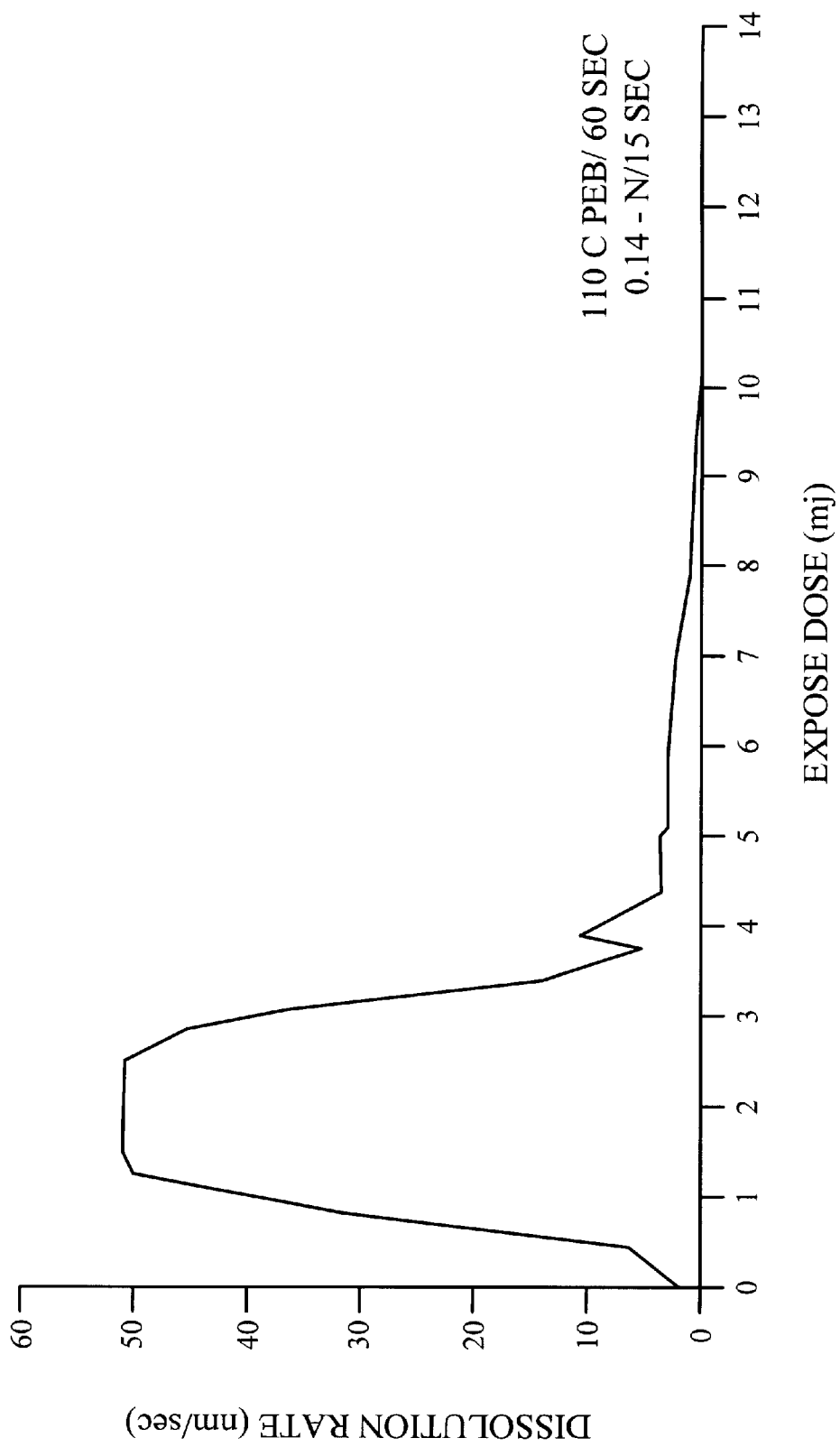
FIG. 6 is a graph showing the dissolution rate in nanometers per second (nm/sec) as a function of the exposure dose in millijoules (mJ) using one formulation of a hybrid resist of the present invention.

The following compositions were dissolved in propyleneglycol monomethylether acetate (PM acetate) solvent available from Pacific Pac, Inc., Hollister, Calif. containing 350 ppm of FC430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1 ]-hept-5-ene-2,3- dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0. 1% of solids. The solution was filtered through a 0.2 µm filter. The solution was coated onto silicon wafers primed with hexamethyl- disilazane with a soft bake of 110° Celsius (C) resulting in films of about 0.8 µm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative crosslinking chemistry becomes predominant and the dissolution rate falls back to a value close to zero.

Figure 10:
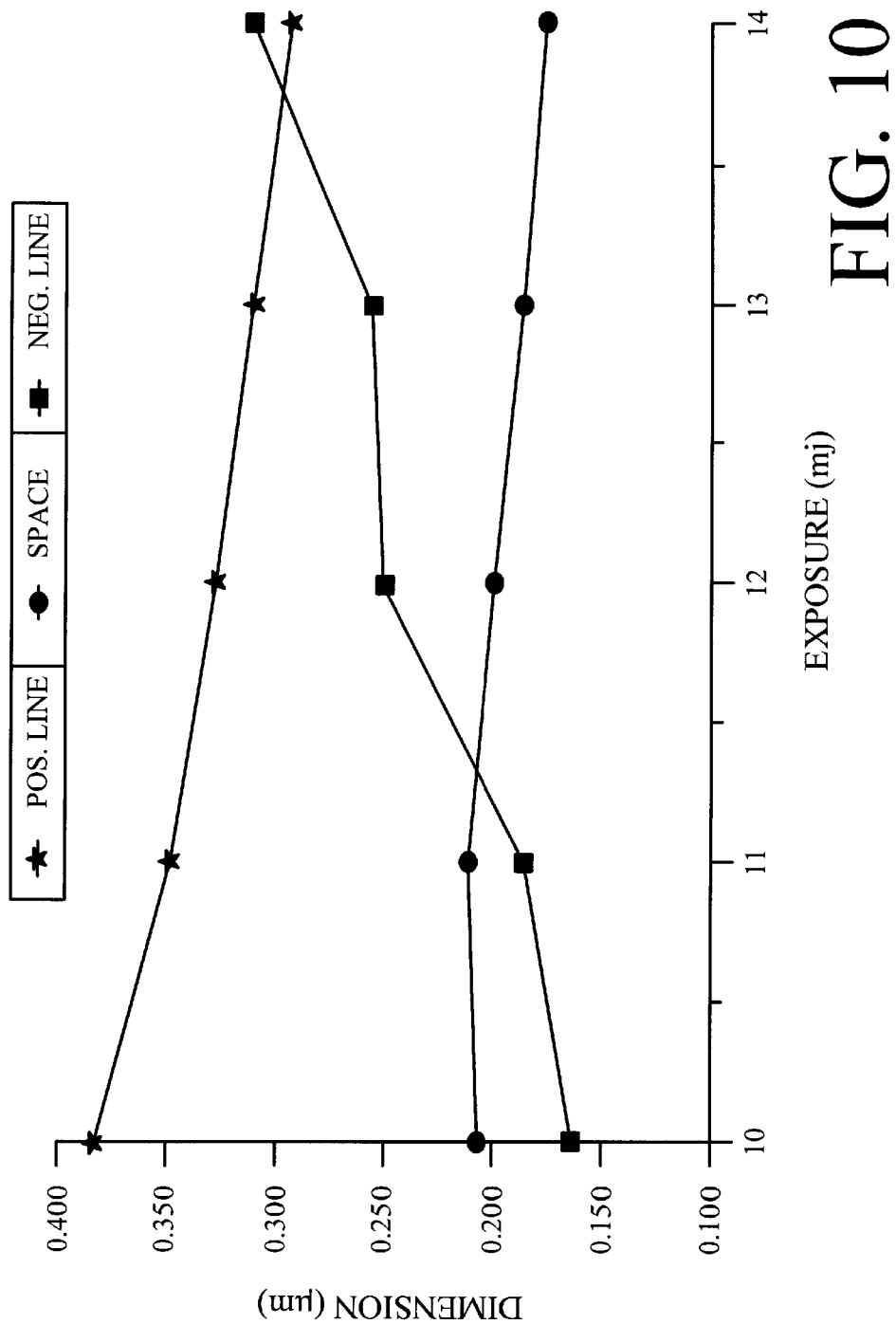
FIG. 10 is a graph of the response of a formulation of the hybrid resist of the present invention in which exposed (negative) line, unexposed (positive) line and space widths are plotted as a function of exposure dose.

A typical lithographic response of this resist is illustrated in FIG. 10, which shows the outcome of exposing the resist through a mask having 1 µm wide nested chrome lines at a pitch of 2 µm with a 248 DUV stepper with a 0.37 NA. Every chrome line and space combination in the mask prints as two lines and two spaces on the resist: a negative line of about 0.8 µm, a positive tone line of about 0.6 µm and two equal spaces of about 0.3 µm.

Figure 7:
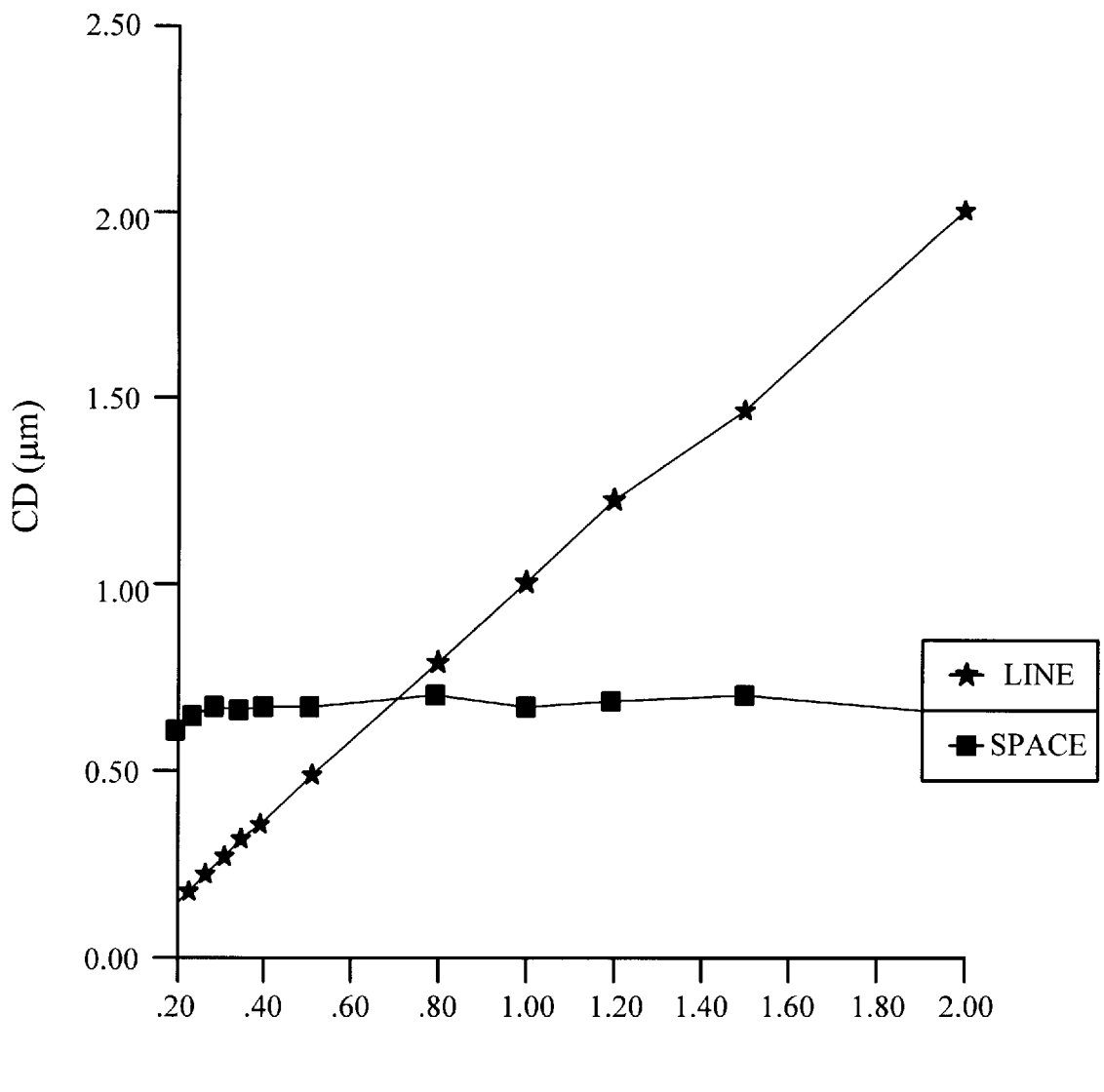
FIG. 7 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 7. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids; Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 8:
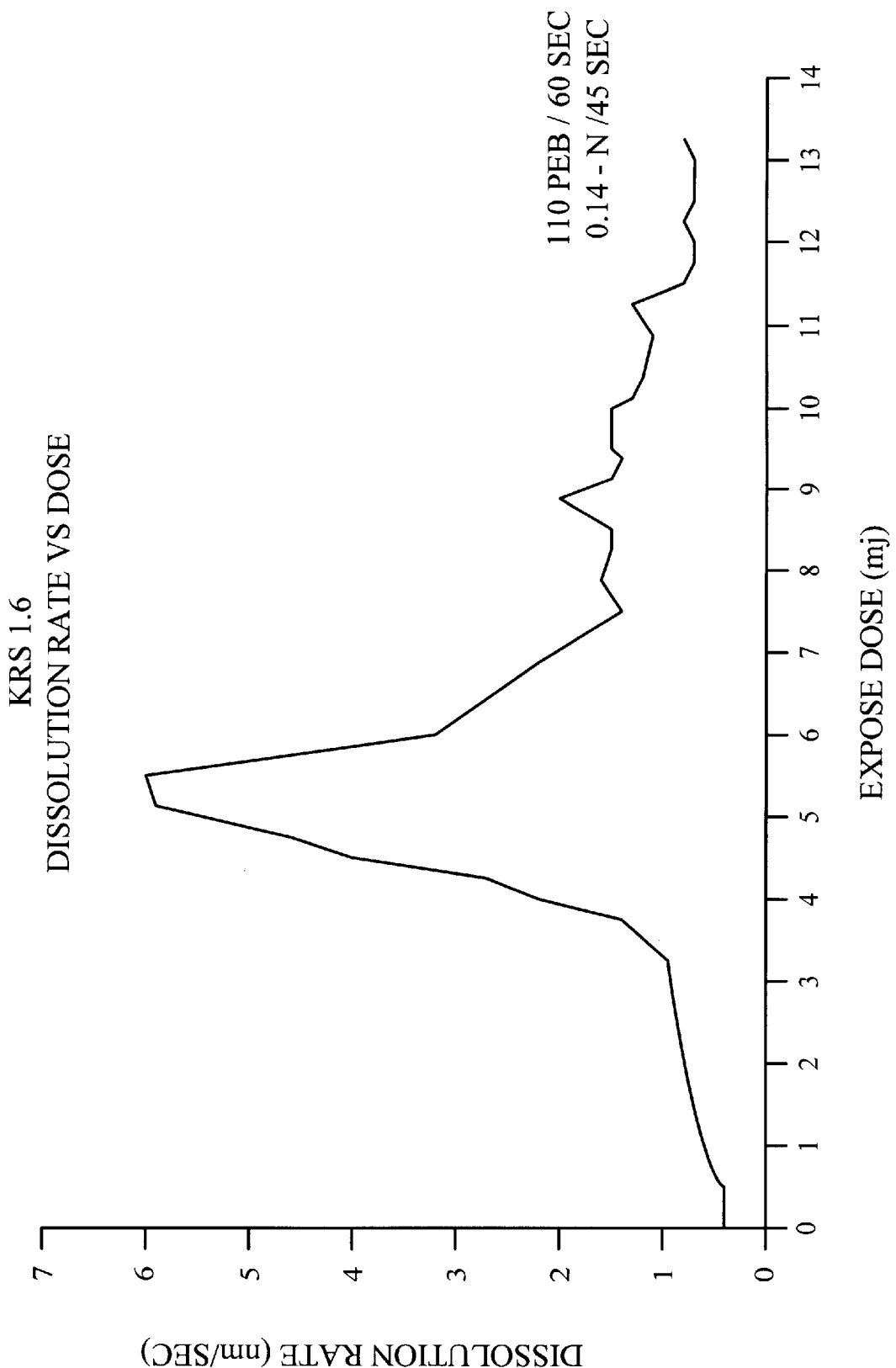
FIG. 8 is a graph showing the dissolution rate of an alternative formulation of the hybrid resist in nm/sec as a function of the exposure dose in mJ.

The dissolution rate characteristic of the resulting hybrid resist is shown in FIG. 8. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 6.

FIG. 10 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 µm, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 µm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0. 14 N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 9.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5 NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$)with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 2 and 3. A large isofocal print bias of approximately 0.11 $\mu$m was observed for the hybrid resist relative to the standard negative resist, as calculated using standard methods known in the art.

Preferred embodiments

Figure 11:
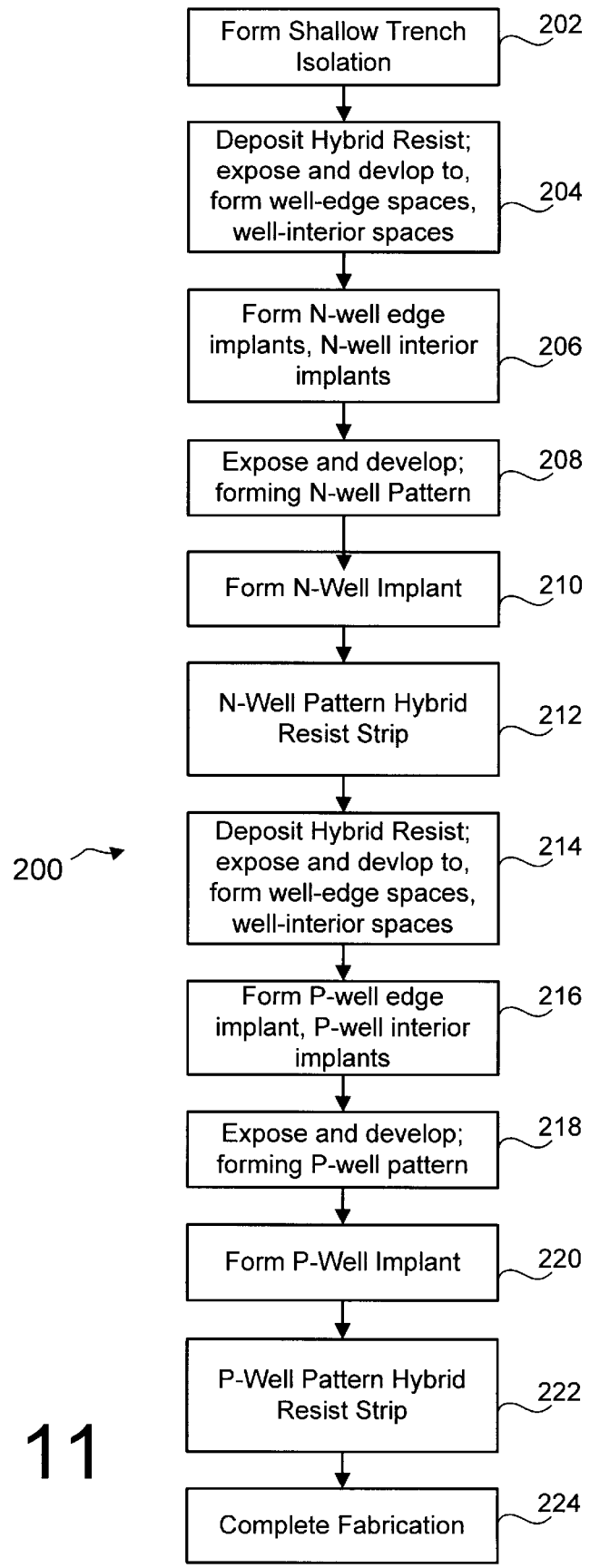
FIG. 11 is a flow diagram representing a fabrication method in accordance with the preferred embodiment.

Turning to FIG. 11, a preferred method 2000 for forming implants in ESD protection devices to reduce the susceptibility of thermal runaway is illustrated. The implants reduce the likelihood of thermal runaway by reducing the heating that occurs during an ESD pulse. The implants are formed at both the edges and interior of the N-wells and at the edges of the P-wells in the ESD device. The method 2000 uses a hybrid resist process at the N-well and P-well implant steps to form well edge implants and interior well implants.

The preferred method begins with a semiconductor substrate as is commonly used in CMOS devices. An example of such a substrate is a wafer portion with a p-type substrate. Of course other suitable substrate materials can be used.

The first step 202 is to form isolation regions between devices. These isolation regions, preferably shallow trench isolation (STI), are used to separate n-type diffusion regions from p-type diffusion regions. The STIs can be formed with any suitable processing method.

Figure 12:
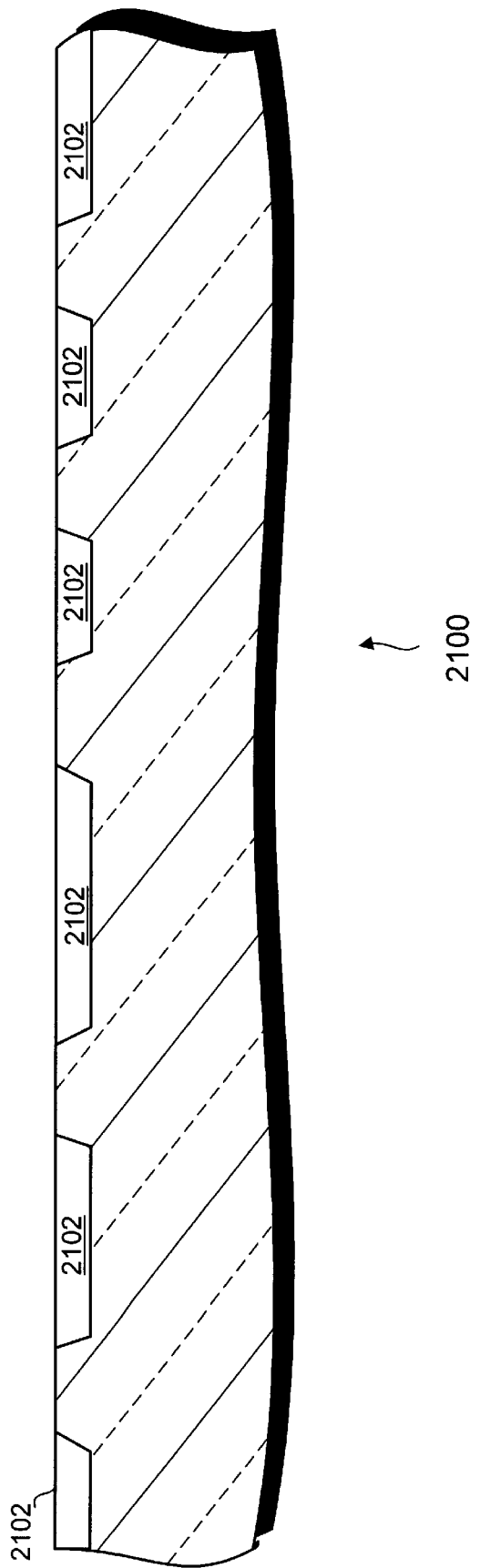
FIG. 12 is a cross-sectional side view of a wafer portion with shallow trench isolations formed within.

Turning to FIG. 12, a wafer portion 2100 is schematically illustrated (not to scale). The wafer portion 2100 preferably comprises a low-doped p-type silicon substrate. In the wafer portion 2100, six shallow trench isolations (STIs) 2102 are formed. STIs 2102 are exemplary of STIs that are suitably formed between various devices on a typical integrated semiconductor device. Further processing steps will create n-type and p-type diffusions that form an ESD protection device in accordance with the preferred embodiment in the wafer portion 2100. STIs 2102 are suitably formed between these various devices. In all these cases the STIs 2102 serve to isolate the devices from each other.

Returning to the method 2000 illustrated in FIG. 11, in general the steps 204–212 form the N-wells, the N-well edge implants and the N-well interior implants. At step 204 hybrid resist is deposited and patterned to form well-edge spaces and well-interior spaces in the resist using the hybrid resist properties.

The hybrid resist is first deposited across the surface of the wafer. The hybrid resist is then exposed to actinic radiation with the areas which are to be N-wells substantially blocked with suitable mask shapes (i. e., chrome mask shapes). The hybrid resist is then developed. Areas which are unexposed (i.e., the N-well regions) remain insoluble in the developer and form positive tone line patterns. Areas which are exposed with high intensity radiation (i.e., the non-N-well regions) form a negative tone line image. Areas which are exposed with intermediate amounts of intensity (i.e., the edges of the N-Well regions and the interior areas of the N-well regions where spaces in the chrome mask exist) are dissolved during the development step.

Figure 13:
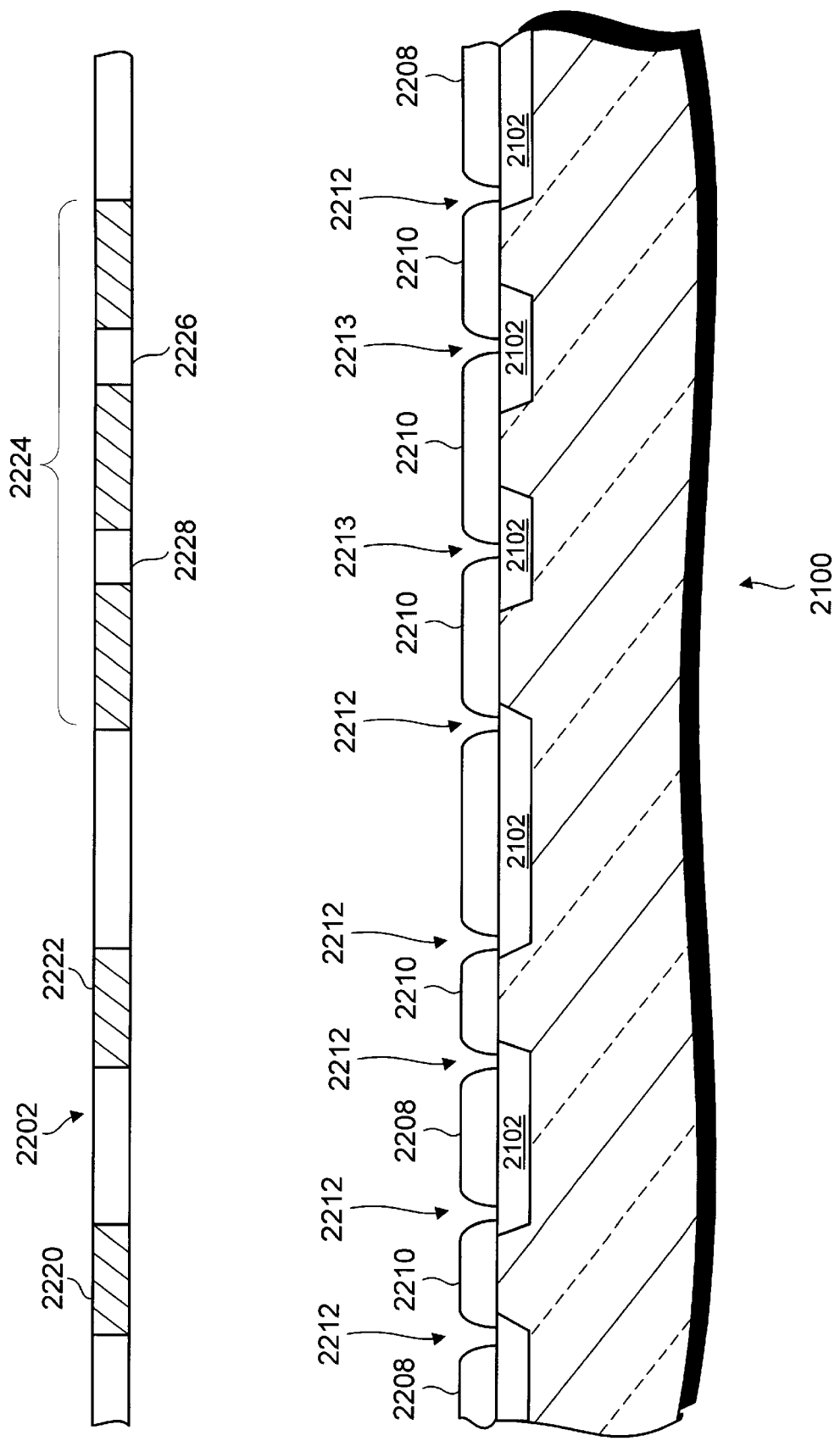
FIG. 13 is a cross-sectional side view of a wafer portion overlaid with hybrid resist and a mask used to pattern the resist for N-well edge implant formation, N-well interior implant formation and N-well formation.

Turning to FIG. 13, the wafer portion 2100 is illustrated with hybrid resist that has been deposited across the surface, exposed and developed. Mask shapes 2220, 2222 and 2224 in mask 2202 block the N-well regions during actinic radiation exposure. Thus, the N-well regions are unexposed and non-N-well regions are highly exposed, with areas of intermediate exposure at transition areas. Apertures 2226 and 2228 are cut out of mask shape 2224. The dimensions of apertures 2226 and 2228 are selected to provide intermediate-level exposure on the hybrid resist below, without allowing high intensity exposure. As such, the apertures are preferably minimum-dimension line cut outs of the mask shape 2224. The apertures 2226 and 2228 are suitably larger provided they are not large enough to allow sufficient radiation to fully expose the areas below. The size of the apertures will thus depend on the specific formulation of the hybrid resist used.

As such, after deposition of the hybrid resist and exposure through mask 2202, positive tone patterns 2210 are formed in the N-well regions (unexposed areas) and negative tone line patterns 2208 are formed in the non-N-well regions (highly exposed areas). Areas that were exposed to intermediate amounts of radiation are dissolved during developing. Thus, at the transition regions between exposed and unexposed, well edge spaces 2212 are formed. These transition regions at which well edge spaces 2212 are formed occur below the edges of the N-well mask shapes. Likewise, well interior spaces 2213 are formed below the cut-outs 2226 and 2228. Because of the unique properties of hybrid photo resist, spaces with dimensions of 0.2 $\mu$m or less can be formed using lithography tools that are designed for operation at 0.35 $\mu$m resolution. Returning to the method 2000 illustrated in FIG. 11, the next step 206 is to form N-well edge implants though the well edge spaces and the N-well interior implants through the well interior spaces. In the preferred embodiment, the N-well edge implants and N-well interior implants preferably comprise N+ implants. The implants are preferably formed by implanting phosphorus (or other donor species) through the well edge shapes. The preferable dose range is between IE12 and IE15 ions/sq-cm with a suitable implant energy that is sufficient to place the dopant species below the bottom of the STI. The dose should be low enough so as not to destroy the sensitivity of the photoactive compound in the hybrid resist. As such, the most preferred implant is phosphorous with a dose of IE 13 ions/sq-cm.

Figure 14:
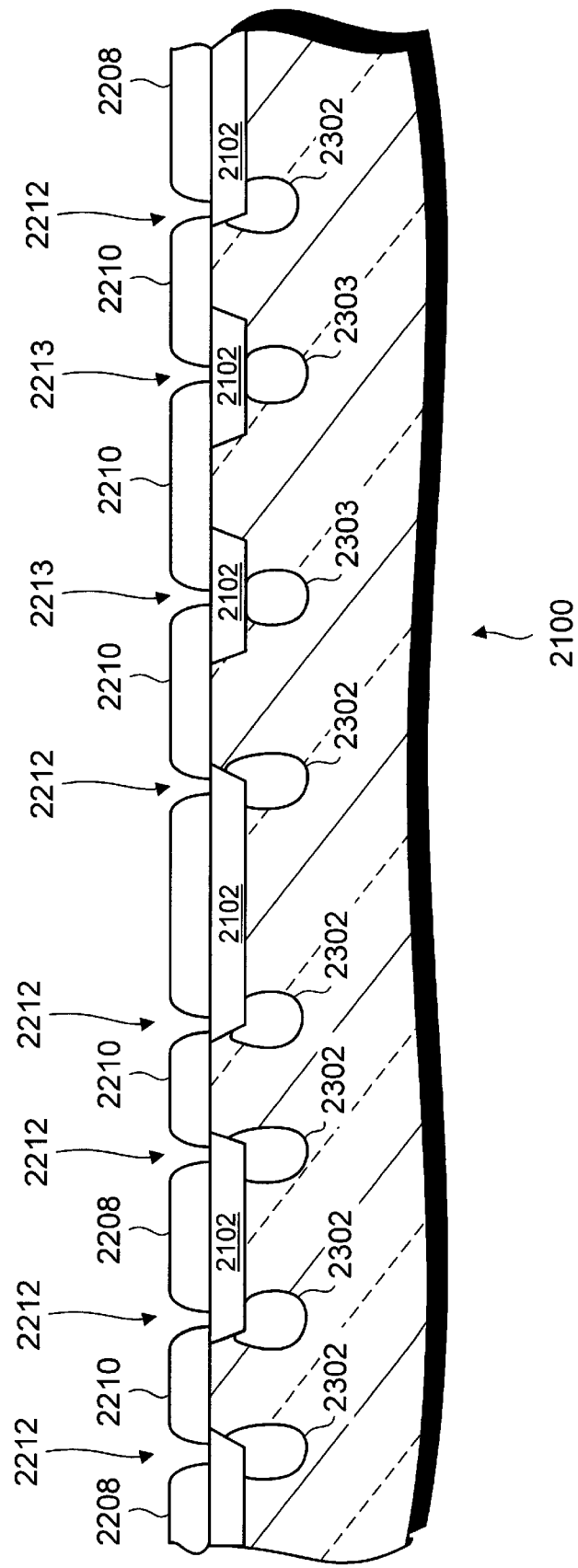
FIG. 14 is a cross-sectional side view of a wafer portion with N-well edge implants and N-well interior implants formed.

Turning to FIG. 14, the wafer portion 2100 is illustrated with N-well edge implants 2302 and N-well interior implants 2303 formed. Returning to the method 2000, the next step 208 is to expose and develop the N-well regions of the hybrid resist. Because the hybrid resist portion above the N-well regions were unexposed, it comprises positive tone patterns. Thus, the hybrid resist portions above the N-well regions can be removed without requiring additional masking steps by blanket exposing the wafer portion and developing away the positive tone patterns. Thus, this removal can be done without requiring additional masking layers.

Figure 15:
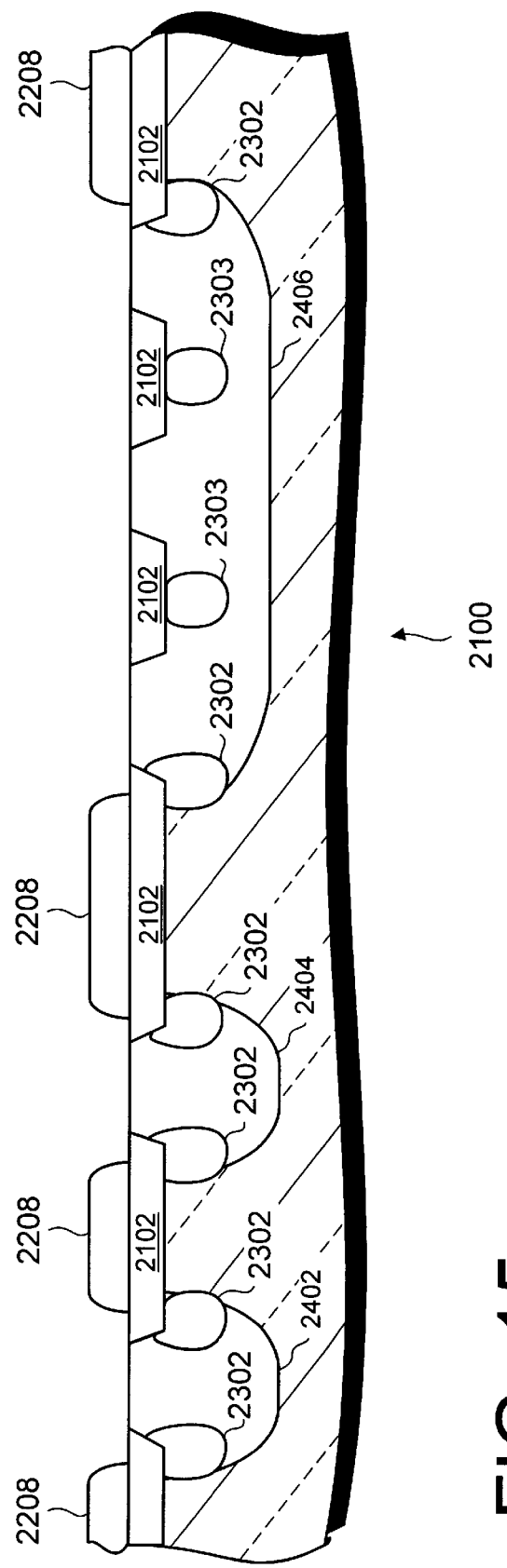
FIG. 15 is a cross-sectional side view of a wafer portion with N-well edge implants, N-well interior implants, and an N-well formed.

At the next step 210, N-wells are formed using any suitable N-type implant technique. Turning to FIG. 15, the wafer portion 2100 is illustrated with the positive tone portions 2210 of the hybrid resist removed and N-wells 2402, 2404 and 2406 implanted into substrate. The remaining negative tone portions 2208 serve to block off the non-N-well regions from receiving the N-type implant. Because the N-well edge implants 2302 share the same negative tone resist structures as the N-wells 2402, 2404 and 2406, they are self aligned to each other. Then, the remaining portions (i.e., the negative tone portions 2208) of the hybrid resist are stripped at step 212.

With the N-wells, the N-well edge implants, and the N-well interior implants formed, steps 214 through 222 form the P-wells and P-well edge implants. At step 214, the P-well edge spaces are formed below the P-well mask edges using hybrid resist properties.

Again, hybrid resist is first deposited across the surface of the wafer. The hybrid resist is then exposed to actinic radiation with the P-well areas blocked with suitable mask shapes (i.e., chrome mask shapes). The hybrid resist is then developed. Areas which are unexposed (i e., the P-well regions) remain insoluble in developer and form a positive tone line pattern. Areas which are exposed with high intensity radiation (i.e., the non-P-well regions) form a negative tone line image. Areas which are exposed with intermediate amounts of intensity (i.e., the edges of the P-Well regions) are dissolved during the development step.

Figure 16:
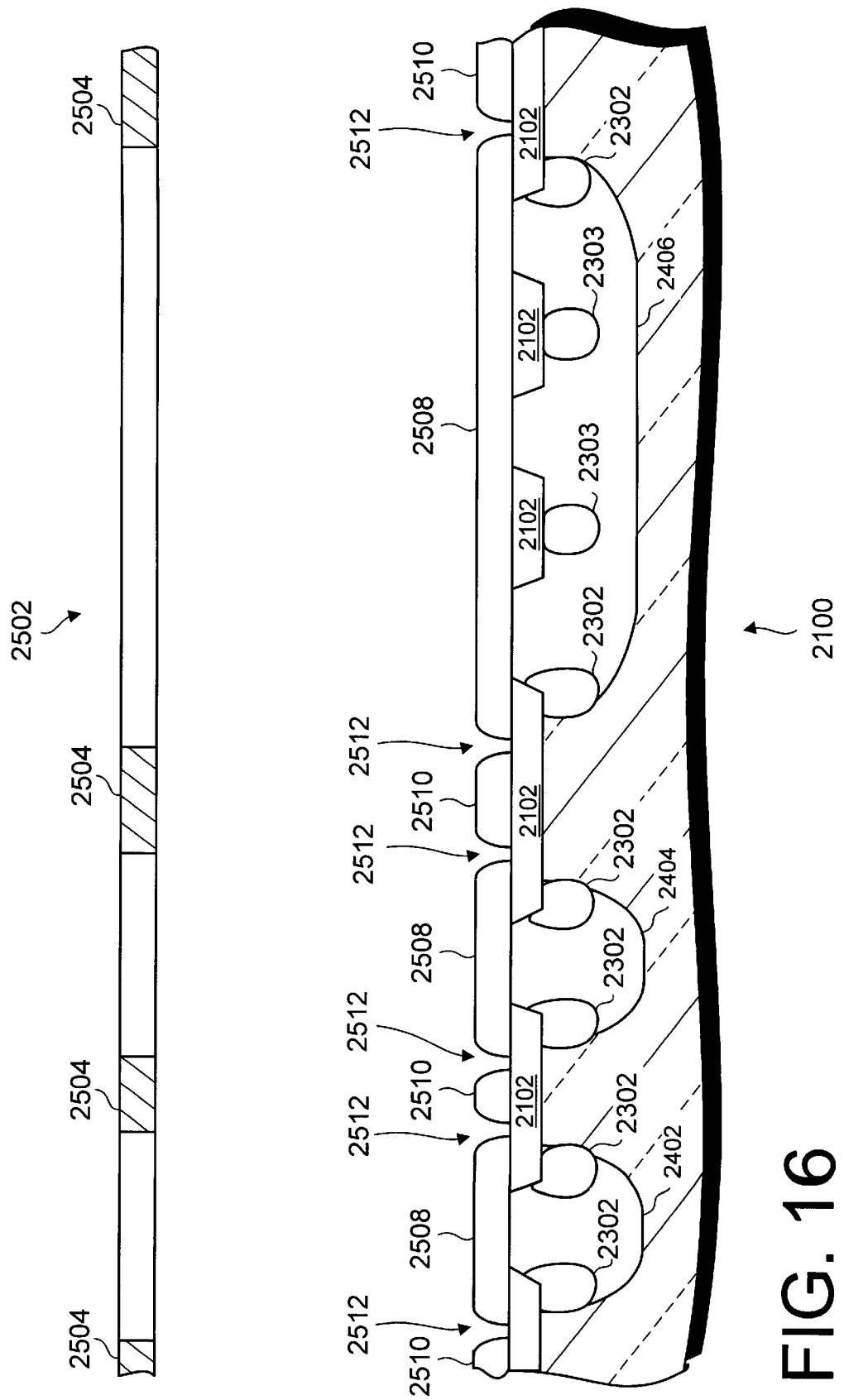
FIG. 16 is a cross-sectional side view of a wafer portion overlaid with hybrid resist and a mask used to pattern the resist for P-well edge implant formation and P-well formation.

Turning to FIG. 16, the wafer portion 2100 is illustrated with hybrid resist deposited across the surface that has been exposed and developed. Chrome regions 2504 in the mask 2502 block the P-well regions during actinic radiation exposure. Thus, the P-well regions are unexposed and non-P-well regions are highly exposed, with areas of intermediate exposure in between (at the edges of the P-well mask shapes). After development, positive tone line patterns 2510 are formed above the P-well regions and a negative tone line pattern 2508 is formed above the non-P-well regions. Areas exposed to intermediate amounts of radiation are dissolved during the develop step, forming well-region edge spaces 2512 at the edges of the P-well regions. Again, because of the unique properties of hybrid photo resist, the spaces with dimensions of 0.2 $\mu$m or less can be formed using lithography tools that are designed for operation at 0.35 $\mu$m resolution.

Returning to the method 2000 illustrated in FIG. 11, the next step 216 is to form P-well edge implants though the well edge spaces 2512. The P-well edge implants are preferably comprise a P+ region around the edges of the P-well. The implants are preferably formed by implanting boron (or other acceptor species) through the well edge shapes. Again, the preferably dose range is between IE12 and IE 15 with a suitable implant energy that is sufficient to place the dopant species below the bottom of the STI. The does should be low enough so as not to destroy the sensitivity of the photoactive compound in the hybrid resist. As such, the preferred implant is boron with a dose of IE13.

Figure 17:
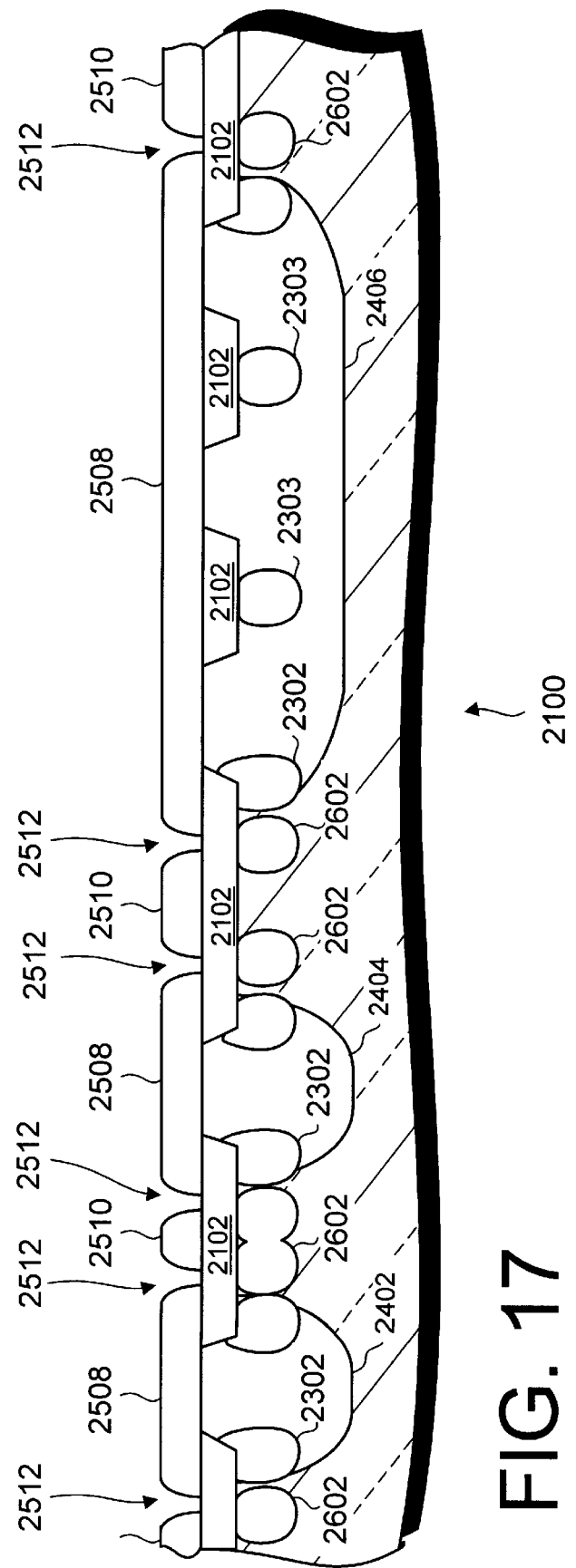
FIG. 17 is a cross-sectional side view of a wafer portion with P-well edge implants.

Turning to FIG. 17, the wafer portion 2100 is illustrated with P-well edge implants 2602 formed. Returning to the method 2000, the next step 218 would be to expose and develop the P-well regions of the hybrid resist. Because the hybrid resist portion above the P-well regions were unexposed, they comprises positive tone patterns. Thus, the hybrid resist portions above the P-well regions can be removed without requiring additional masking steps by blanket exposing the wafer portion and developing away the positive tone patterns.

Figure 18:
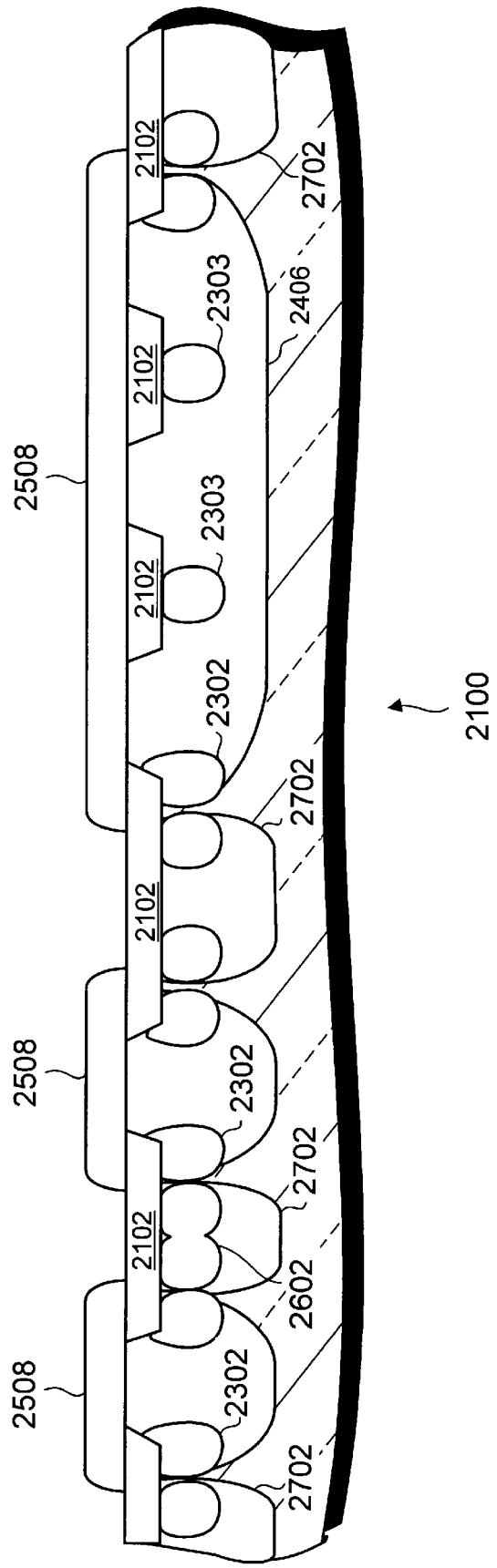
FIG. 18 is a cross-sectional side view of a wafer portion with P-well edge implants and the P-well formed.

At the next step 220, P-wells are formed using any suitable P-type implant technique. Turning to FIG. 18, the wafer portion 2100 is illustrated with the positive tone portions 2510 of the hybrid resist removed and P-wells 2702 implanted into the substrate. The remaining negative tone portions 2508 serve to block the non-P-well regions from receiving the P-type implant. Because the P-well edge implants 2602 share the same negative tone resist structures as P-well 2702, they are self-aligned to each other. Then, the remaining portions (i.e., the negative tone portions 2208) of the hybrid resist are stripped.

In an alternative embodiment, the steps of forming P-wells and P-well edge implants is eliminated, and instead a higher doped substrate is used as starting material to provide the required p-type doping.

Figure 19:
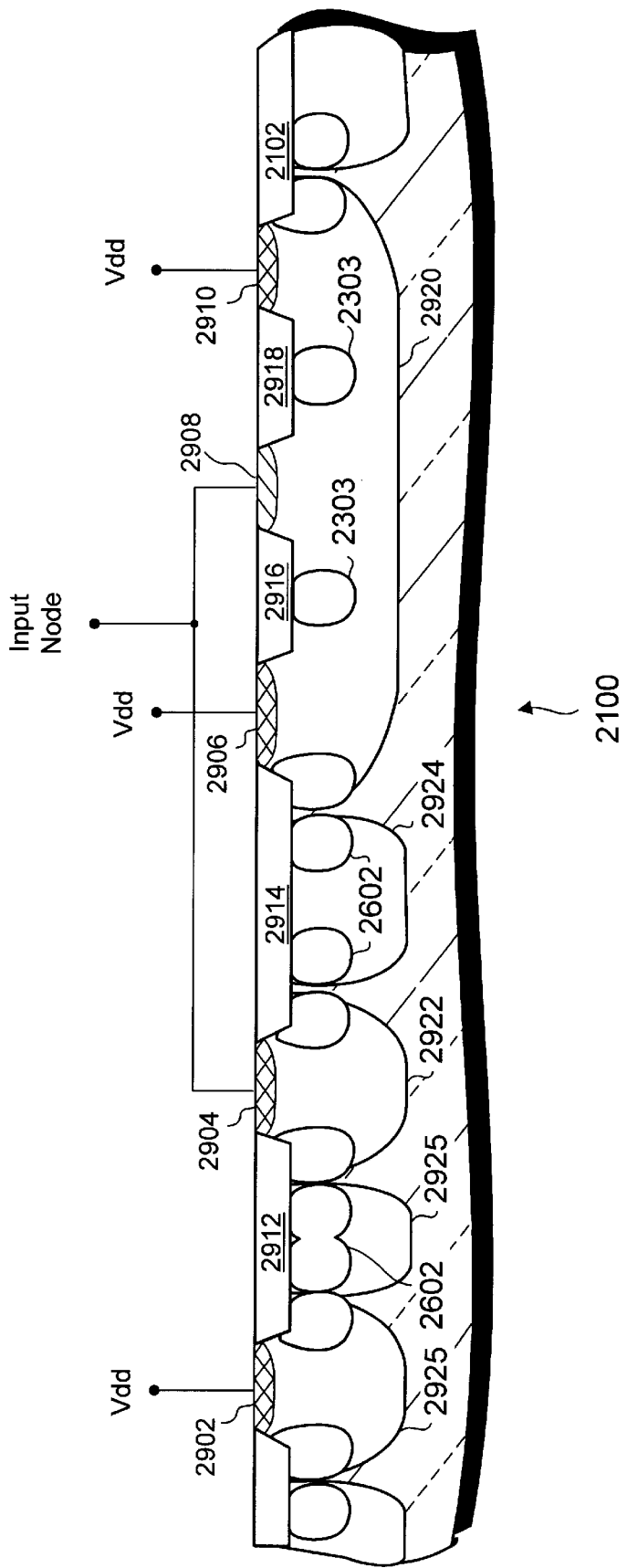
FIG. 19 is a cross-sectional side view of an ESD structure in accordance with the preferred embodiment.

The wafer portion 2100 can then be completed using suitable fabrication techniques, i.e., forming diffusion regions that comprise the rest of the ESD protection device. Turning to FIG. 19, the wafer portion 2100 is illustrated with the N++ and P+ diffusion regions that form the inputs to the ESD protection device. In particular, No diffusions 2902, 2904, 2906, 2910 and P++ diffusion 2908 are formed using any standard fabrication technique.

Thus, FIG. 19 illustrates a cross sectional schematic view of an ESD structure in accordance with the preferred embodiment. In FIG. 19, some of the elements have been renumbered to allow for discussion of individual elements. The ESD structure in wafer potion 2100 can be used to provide ESD protection by connecting its input to devices in a variety of applications.

The illustrated ESD device is generally referred to as a dual diode device. In particular, the Pa diffusion 2908 and its n-well 2920 comprise a first diode, with the P++ diffusion 2908 being the anode and n-well 2920 being the cathode. Likewise, the N++ diffusion 2904 and the its n-well 2922 combine to form the cathode of the second diode with the p-type substrate being the anode. Thus, the ESD device comprises two stacked diodes, with one attached to ground (through the substrate) and the other attached to Vdd (through the N-well), and with input node connected to the node between them. Those skilled in the art will recognize that the preferred embodiment is not limited to dual diode ESD structures, but can be applied to any type of ESD protection device.

The ESD protection device input node is coupled to a P+ diffusion 2908 and to N++ diffusion 2904. The ESD structure is also connected to bias Vdd at several diffusion regions, in particular, to N++ diffusions 2902,2906, and 2910. Between the various diffusions and wells are the various shallow trench isolation (STI) structures 2102, 2912, 2914, 2916 and 2918. The STI structures serve to isolate the diffusion regions from each other.

By connecting the input node to other devices (i.e., input buffers), the input node is able to absorb electrostatic discharges before the connected device is damaged. For example, assuming an ESD pulse positive with respect to Vdd strikes the input node. This forward biases the P++ diffusion 2908/n-well 2920 junction (diode 1) and current flows laterally from the P++ diffusion 2908 to both N++ diffusion 2906 and No diffusion 2910 (connections to Vdd).

If these currents are large enough (i.e., if the ESD pulse is large enough), the ESD protection device is highly susceptible to thermal runaway. According to the preferred embodiment however, the localized N-well interior implants 2303 under the STI's will increase the intrinsic temperature, reduce the Joule ($I^2R$) heating under the STI's and reduce the likelihood of thermal runaway.

This has the effect of making the ESD structure in accordance with the preferred embodiment more robust that prior art ESD structures, i.e., able to absorb greater pulses without thermal runaway failure. Furthermore, the preferred embodiment allows for greater scaling of the STI dimensions, overcoming a significant stumbling block to greater device scaling.

In a likewise manner, the P+ well edge implants 2602 improve the ESD robustness of the ESD protection structure. In particular, the P+ implants 2602 improve the ESD robustness by increasing the intrinsic temperature locally under the isolations 2912 and 2914, reducing the Joule heating under the isolations and establishing a dopant gradient forcing current to flow from the isolation regions.

For example, when an ESD pulse negative with respect to Vdd hits the input node, current flows laterally from N-well 2923 to N-well 2922 through P-well 2925. If the current is large enough it can cause the temperature to rise above the silicon melting temperature, particularly at the silicon/STI 2912 interface. If this happens, the ESD protection device can be permanently damaged.

The P+ well edge implants under the isolation increase the ESD robustness and decrease the likelihood of damage by increasing the intrinsic temperature locally under the isolation, reducing the Joule heating under the isolation and establishing a dopant gradient forcing current to flow away from the isolation region.

Additionally, the P+ and N+ well edge implants reduce the gain of the parasitic bipolar transistors, reducing the likelihood of latch-up and avoiding punch through (e.g., N+ to N+ punch through, N+ to well punch through). These implants have the advantage over other solutions in that they can formed without impacting the well metallurgical junction of the well leakage.

The preferred embodiment of the present invention can also be applied to ESD structures that use buried resistor elements. Buried resistors are elements that are commonly used in I/O circuitry for impedance matching between I/O circuitry and external impedances. In ESD protection devices buried resistors are commonly used for delay MOSFET secondary breakdown.

Figure 20:
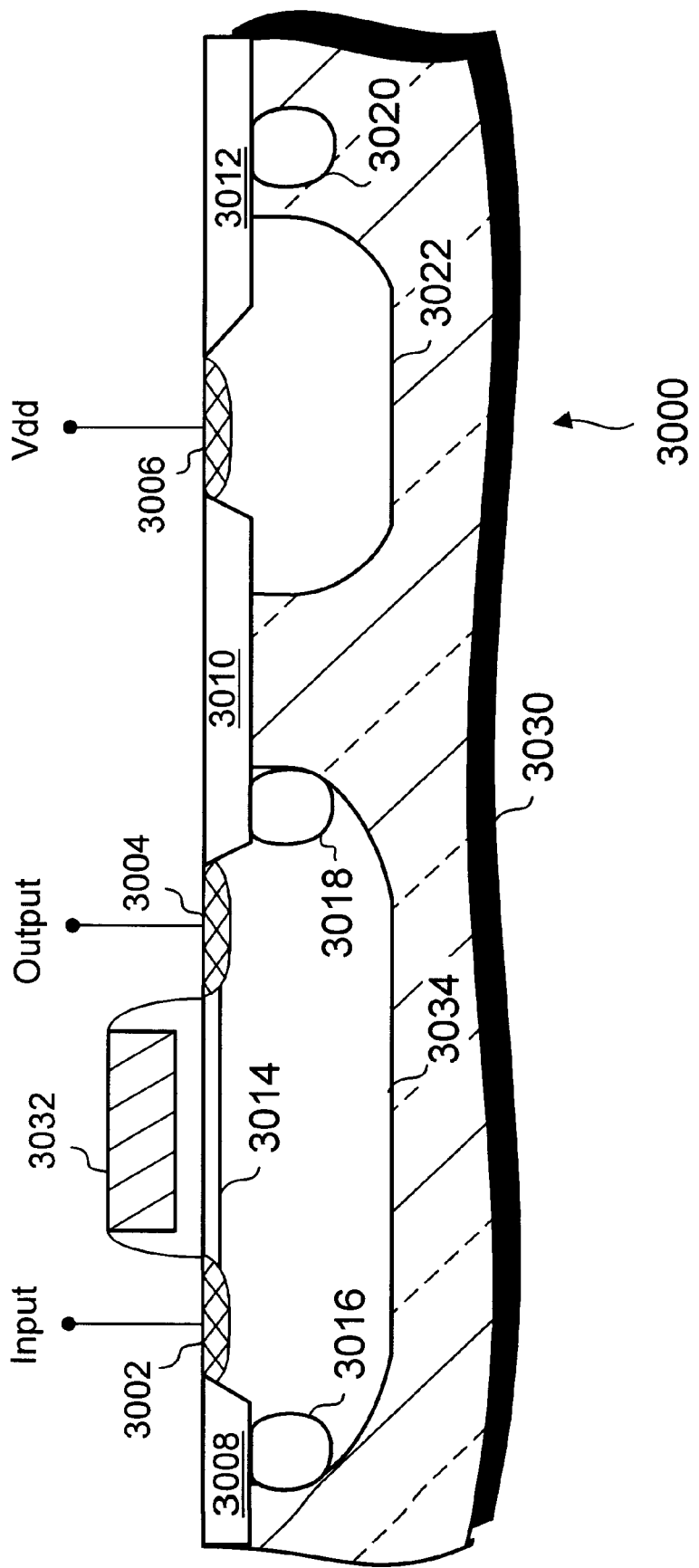
FIG. 20 is a cross-sectional side view of a semiconductor portion containing a buried resistor and a guard ring in accordance with the preferred embodiment.

Turning to FIG. 20, a semiconductor portion 3000 is illustrated that contains a portion of a guard ring and a buried resistor that would be part of a ESD protection device in accordance with the prefer-red embodiment. The illustrated buried resistor is an N-type buried resistor formed in a P-well 3034. The N-type buried resistor comprises a N+ source implant 3002 and N+ drain implant 3004, a gate structure 3032, and an N- region 3014 in the channel under the gate 3032 and between the source 3002 and drain 3004. The guard ring in semiconductor portion 3000 comprises N-well 3022 and N+ diffusion 3006 tied to Vdd.

Device failure can occur when large negative pulses cause large currents to flow between the buried resistor and the guard ring. The failure mechanism is generally identical to those in the discussed before, i.e., the large currents causing device heating at the STI 3010—substrate 3030 interface which can lead to thermal runaway.

Thus, the preferred embodiment can improve the robustness of ESD devices that use buried resistors by forming an implant 3018 under the STI 3010 between the N-well 3022 and the buried resistor. The implant 3018 is in this application is preferably an P+ well-edge implant formed at the edge of P-well 3034. Likewise, a second well-edge implant 3016 is formed at the of P-well 3034. These implants are preferably formed using the same procedure as the well-edge implants previously discussed, i.e., using the properties of hybrid resist to form well edge spaces and implanting through those spaces.

The implants 3016 and 3018 improve the robustness of the ESD protection device by increasing the intrinsic temperature at interface between the STI's and the substrate. This will further improve the ability to scale the space between the buried resistor element and the adjacent guard ring structure maintaining ESD robustness with structural scaling.

It should be noted that while the preferred method for fabricating the ESD structure uses hybrid resist to facilitate sub-critical dimension implants (i.e., considerably less than the STI structure width so as not to effect the leakage or capacitance of the N+ and/or P++ diffusions at each side) the preferred ESD structure is not limited to being fabricated by this method. In particular, traditional fabrication techniques can be used to form the implants 2303, although these traditional techniques may lack the ability to create sub-critical lines in a self aligned fashion and not have the same ability to control line width as the hybrid resist methods.

Thus, the preferred embodiments provides a method and structure for forming ESD with well edge implants and well interior implants under STI that reduces the likelihood of thermal runaway from Joule heating. By using the unique properties of hybrid photoresist, the implants are self aligned to the wells and are formed without requiring additionally masking steps. The implants increase the robustness of the ESD structures, and thus allows ESD structures to be further scaled down without unacceptably decreasing the ESD protection levels as well as its effectiveness to protect other circuitry.

While the invention has been particularly shown and described with reference to a preferred exemplary embodiment using edge implants formed with hybrid resist at the edges of P-wells and N-wells, it will be understood by those skilled in the art that various changes in form and details may be made therein without departing from the spirit and scope of the invention. In particular, the use of positive tone portions of the hybrid resist defining the well areas can be exchanged for negative tone portions. It is also understood by those skilled in the art that the invention is applicable to different isolation technologies (e.g., LOCOS, STI, etc. ) well and substrate technologies, dopant types and energies. It is understood that the spirit of the invention is applicable to other semiconductor-based technologies (e.g., BiCMOS, bipolar, SOI and SiGe).

What is claimed is:

1. A dual-diode electrostatic discharge protection device comprising:
   a) a semiconductor substrate;
   b) a first diode formed in said semiconductor substrate, the first diode including:
      i) a first well formed in said semiconductor substrate, the first well comprising a first diode cathode;
      ii) a first diffusion formed in the first well, the first diffusion comprising a first diode anode,
   c) a second diode formed in said semiconductor substrate, the second diode including:
      i) a second well formed in said semiconductor substrate,
      ii) a second diffusion formed in the second well, the second well and the second diffusion comprising a second diode cathode and said semiconductor substrate comprising a second diode anode;
   d) at least one implant formed at an edge of the first well;
   e) at least one implant formed at an edge of the second well; and
   f) an input, the input coupled to the first diffusion and said second diffusion and to a protected device such that the protected device is protected from electrostatic discharge; and wherein said semiconductor substrate comprises a p-type substrate, wherein said first well comprises a n-type well, wherein said first diffusion comprises a p-type diffusion, wherein the at least one implant formed at an edge of the first well comprises a n-type implant, wherein the second well comprises a n-type well, wherein the second diffusion comprises a n-type diffusion, and wherein the at least one implant formed at an edge of the second well comprises a n-type implant.

2. A dual-diode electrostatic discharge protection device comprising:

a) a semiconductor substrate;
b) a first diode formed in said semiconductor substrate, the first diode including:
   i) a first well formed in said semiconductor substrate the first well comprising a first diode cathode;
   ii) a first diffusion formed in the first well, the first diffusion comprising a first diode anode;
c) a second diode formed in said semiconductor substrate, the second diode including:
   i) a second well formed in said semiconductor substrate,
   ii) a second diffusion formed in the second well, the second well and the second diffusion comprising a second diode cathode and said semiconductor substrate comprising a second diode anode;
d) at least one implant formed at an edge of the first well;
e) at least one implant formed at an edge of the second well;
f) an input, the input coupled to the first diffusion and said second diffusion and to a protected device such that the protected device is protected from electrostatic discharge;
g) at least one isolation region formed in said first well; and
h) at least one implant formed under said isolation region in said first well.

3. The dual-diode electrostatic discharge protection device of claim 2 wherein said semiconductor substrate comprises a p-type substrate, wherein said first well comprises a n-type well, and wherein said at least one implant formed under said isolation region in said first well comprises a n-type implant.

4. The dual-diode electrostatic discharge protection device of claim 2 further comprising a n-type diffusion formed in said first well between said isolation region and one of said at least one implant formed at an edge of the first well, and wherein said n-type diffusion is coupled to a high potential.

5. A dual-diode electrostatic discharge protection device comprising:

a) a semiconductor substrate;
b) a first diode formed in said semiconductor substrate the first diode including;
   i) a first well formed in said semiconductor substrate the first well comprising a first diode cathode;
   ii) a first diffusion formed in the first well the first diffusion comprising a first diode anode;
c) a second diode formed in said semiconductor substrate the second diode including:
   i) a second well formed in said semiconductor substrate,
   ii) a second diffusion formed in the second well the second well and the second diffusion comprising a second diode cathode and said semiconductor substrate comprising a second diode anode;
d) at least one implant formed at an edge of the first well;
e) at least one implant formed at an edge of the second well;
f) an input the input coupled to the first diffusion and said second diffusion and to a protected device such that the protected device is protected from electrostatic discharge;
g) an isolation region formed between said first well and said second well;
h) a third well formed under said isolation region between said first well and said second well;
i) at least one implant formed at an edge of said third well.

6. The dual-diode electrostatic discharge protection device of claim 5 wherein said semiconductor substrate comprises a p-type substrate, wherein said third well well comprises a p-type well, wherein the at least one implant formed at an edge of the third well comprises a p+ implant.

7. The dual-diode electrostatic discharge protection device of claim 5 further comprising:

g) a fourth well formed in said semiconductor substrate;
h) a fourth diffusion formed in said fourth well, said fourth diffusion coupled to a high potential; and
i) at least one implant formed at an edge of said fourth well.

8. The dual-diode electrostatic discharge protection device of claim 7 further comprising j) an isolation region formed between said fourth well and sand second well;
k) a fifth well formed under said isolation region formed between said fourth well and said second well;
l) at least one implant formed at an edge of said fifth well, the at least one implant formed at an edge of said fifth well combing with said at least one implant formed at an edge of said fourth well and with said at least one implant formed at an edge of said second well to form a buried diode.

9. The dual-diode electrostatic discharge protection device of claim 7 wherein said semiconductor substrate comprises a p-type substrate, wherein said first well comprises a n-type well, wherein said first diffusion comprises a p-type diffusion, wherein the at least one implant formed at an edge of the first well comprises a n-type implant, wherein the second well comprises a n-type well, wherein the second diffusion comprises a n-type diffusion, wherein the at least one implant formed at an edge of the second well comprises a n-type implant, wherein the fourth well comprises a n-type well, wherein the fourth diffusion comprises an n-type diffusion, and wherein the at least one implant formed at an edge of said forth well comprises an n-type implant.

10. The dual-diode electrostatic discharge protection device of claim 7 wherein said semiconductor substrate comprises a p-type substrate, wherein said first well comprises a n-type well, wherein said first diffusion comprises a p-type diffusion, wherein the at least one implant formed at an edge of the first well comprises a n-type implant, wherein the second well comprises a n-type well, wherein the second diffusion comprises a n-type diffusion, wherein the at least one implant formed at an edge of the second well comprises a n-type implant, wherein the fourth well comprises a n-type well; wherein the fourth diffusion comprises an n-type diffusion, wherein the at least one implant formed at an edge of said forth well comprises an n-type implant, wherein the fifth well comprises a p-type well, and wherein the at least one implant formed at an edge of said fifth well comprises a p-type implant.

11. A dual-diode electrostatic discharge protection device comprising:

a) a p-type semiconductor substrate;

b) a first diode formed in said semiconductor substrate, the first diode including:
   i) a first n-well formed in said semiconductor substrate, the first well comprising a first diode cathode;
   ii) a first p+ diffusion formed in the first well, the first diffusion comprising a first diode anode;
c) a second diode formed in said semiconductor substrate, the second diode including:
   i) a second n-well formed in said semiconductor substrate;
   ii) a first n+ diffusion formed in the second well, the second n-well and the first n+ diffusion comprising a second diode cathode and said semiconductor substrate comprising a second diode anode;
d) at least one n+ implant formed at an edge of the first well;
e) at least one n+ implant formed at an edge of the second well,
f) at least one isolation region formed in said first n-well;
g) a n+ diffusion formed in said first n-well between said isolation region and one of said at least one implant formed at an edge of the first n-well, and wherein said n+ diffusion is coupled to a high potential;
h) an input, the input coupled to the fist diffusion and said second diffusion and to a protected device such that the protected device is protected from electrostatic discharge.

12. The dual-diode electrostatic discharge protection device of claim 4 further comprising:
   i) an isolation region formed between said first n-well and said second n-well;
   j) a first p-well formed under said isolation region between said first n-well and said second n-well;
   k) at least one p+ implant formed at an edge of said first p-well.

13. The dual-diode electrostatic discharge protection device of claim 11 further comprising:
   i) a third n-well formed in said semiconductor substrate;
   j) a second n+ diffusion formed in said third n-well well, said second n+ diffusion coupled to a high potential; and
   k) at least one n+ implant formed at an edge of said third n-well.

14. The dual-diode electrostatic discharge protection device of claim 13 further comprising:
   l) an isolation region formed between said third n-well and said second n-well;
   o) a second p-well formed under said isolation region formed between said third n-well and said second n-well; and
   q) at least one p+ implant formed at an edge of said second p-well, the at least one p+ implant formed at an edge of said second p-well combing with said at least one n+ implant formed at an edge of said third n-well and with said at least one n+ implant formed at an edge of said second n-well to form a buried diode.

15. A dual-diode electrostatic discharge protection device comprising:
   a) a p-type semiconductor substrate;
   b) a first diode formed in said semiconductor substrate, the first diode including:
      i) a first n-well formed in said semiconductor substrate, the first n-well comprising a first diode cathode;
      ii) a first p+ diffusion formed in the first well, the first p+ diffusion comprising a first diode anode;
   c) a second diode formed in said semiconductor substrate, the second diode including:
      i) a second n-well formed in said semiconductor substrate;
      ii) a first n+diffusion formed in the second n-well, the second n-well and the second n+ diffusion comprising a second diode cathode and said semiconductor substrate comprising a second diode anode;
   d) at least one n+implant formed at an edge of the first n-well;
   e) at least one n+implant formed at an edge of the second n-well;
   f) at least one isolation region formed in said first n-well;
   g) a n+ diffusion formed in said first n-well between said isolation region and one of said at least one implant formed at an edge of the first n-well, and wherein said n+ diffusion is coupled to a high potential;
   h) at least one n+ implant formed under said isolation region in said first n-well;
   i) an isolation region formed between said first n-well and said second n-well;
   j) a first p-well formed under said isolation region between said first n-well and said second n-well;
   k) at least one p+ implant formed at an edge of said first p-well;
   l) a third n-well formed in said semiconductor substrate;
   m) a second n+ diffusion formed in said third n-well, said second n+ diffusion coupled to a high potential;
   n) at least one n+ implant formed at an edge of said third n-well;
   o) an isolation region formed between said third n-well and said second n-well;
   p) a second p-well formed under said isolation region formed between said third n-well and said second n-well;
   q) at least one p+ implant formed at an edge of said second p-well, the at least one p+ implant formed at an edge of said second p-well combing with said at least one n+ implant formed at an edge of said third n-well and with said at least one n+ implant formed at an edge of said second n-well to form a buried diode; and
   r) an input, the input coupled to the first diffusion and said second diffusion and to a protected device such that the protected device is protected from electrostatic discharge.

* * * * *

UNITED STATES PATENT AND TRADEMARK OFFICE
CERTIFICATE OF CORRECTION

PATENT NO. : 6,218,704 B1
DATED : April 17, 2001
INVENTOR(S) : Brown, et al.

Page 1 of 1

It is certified that error appears in the above-identified patent and that said Letters Patent is hereby corrected as shown below:

Title page, item [54], and column 1,
Lines 1-2, The title should read as follows: -- ESD PROTECTION STRUCTURE WITH IMPLANTS UNDER TRENCH ISOLATION STRUCTURES -- .

Column 1,
Line 19, change the word "Modem" to read -- Modern --.

Column 7,
Line 63, change "...the print bias of 10 the negative tone line" to read -- ... the print bias of the negative tone line. --

Column 13,
Line 31, change" ...trench isolation (STID, are used to separate n-type..."
to read -- ... trench isolation (STI), are used to separate ... --

Column 16,
Line 35, change "... coupled to a P+ diffusion 2908..." to read -- ...is coupled to a P++ diffusion 2908... --

Signed and Sealed this

Eleventh Day of September, 2001

Attest:

NICHOLAS P. GODICI
*Acting Director of the United States Patent and Trademark Office*

*Attesting Officer*